United States Patent
Asano

(10) Patent No.: US 6,741,621 B2
(45) Date of Patent: May 25, 2004

(54) LASER IRRADIATION APPARATUS AND METHOD OF TREATING SEMICONDUCTOR THIN FILM

(75) Inventor: Akihiko Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/242,251

(22) Filed: Sep. 12, 2002

(65) Prior Publication Data

US 2003/0057418 A1 Mar. 27, 2003

(30) Foreign Application Priority Data

Sep. 14, 2001 (JP) ......................................... 2001-279165

(51) Int. Cl.[7] ................................................ H01S 3/10
(52) U.S. Cl. ........................................... 372/28; 372/27
(58) Field of Search ......................... 372/28, 27, 29.01, 372/26; 250/201.3; 356/457, 513, 498

(56) References Cited

U.S. PATENT DOCUMENTS

| | | | |
|---|---|---|---|
| 6,271,924 B1 * | 8/2001 | Ngoi et al. .................. | 356/489 |
| 6,344,898 B1 * | 2/2002 | Gemma et al. ............. | 356/513 |
| 6,441,356 B1 * | 8/2002 | Mandella et al. ......... | 250/201.3 |
| 6,525,821 B1 * | 2/2003 | Thomas et al. ............. | 356/457 |

* cited by examiner

Primary Examiner—Paul Ip
Assistant Examiner—Tuan Nguyen
(74) Attorney, Agent, or Firm—Robert J. Depke; Holland & Knight LLP

(57) ABSTRACT

A laser irradiation apparatus includes a laser light generation element, a splitting element for splitting laser light generated from the laser light generation element, a light interference element for causing a first beam and a second beam of the laser light split by the splitting element to interfere with each other to form a periodic light pattern, and a phase shifting element for electro-optically shifting the phase of the first beam. The laser light generation element is a pulse oscillation laser based on laser diode excitation.

12 Claims, 14 Drawing Sheets

LASER IRRADIATION APPARATUS AND METHOD OF TREATING SEMICONDUCTOR THIN FILM

BACKGROUND OF THE INVENTION

The present invention relates to a laser irradiation apparatus and a method of treating a semiconductor thin film, and particularly to a laser irradiation apparatus used preferably for a treatment for crystallizing a semiconductor thin film, and a method of treating a semiconductor thin film conducted by use of the laser irradiation apparatus.

Thin film transistors (abbreviated to TFT) widely used as switching devices for flat-type display systems such as liquid crystal display systems include the TFT using polycrystalline silicon as an active layer (polycrystalline silicon TFT) and the TFT using amorphous silicon as an active layer (amorphous silicon TFT). Among these, the polycrystalline silicon TFT is higher in driving current as compared with the amorphous silicon TFT, so that it has the merit that it is possible to miniaturize the switching devices and enlarge the numerical aperture of pixel. In addition, the polycrystalline silicon TFT can be used not only as the switching device but also as peripheral driving circuits, for example, a shift register or a level converter, and these peripheral circuits can be formed on a display substrate in the same step as formation of the switching device. For these reasons, the polycrystalline silicon TFT is used as a device for high-precision display systems.

In recent years, a technology for fabricating the polycrystalline silicon TFT by a low-temperature process at or below 600° C. (the so-called low temperature polysilicon process) has been developed and put to practical use. By applying the low temperature polysilicon process to the production of a flat-type display system, it becomes unnecessary to use a high heat-resistant but expensive substrate such as quartz and single-crystalline silicon as the display substrate, so that it is possible to achieve reductions in cost and size of the high-precision flat-type display system.

Here, the low temperature polysilicon process is a method of obtaining a polycrystalline silicon layer by irradiating a silicon layer (amorphous silicon layer) formed on a substrate with laser light or electron beam to rapidly heat and melt the silicon without damaging the substrate, and crystallizing the silicon through the subsequent cooling process to obtain the polycrystalline silicon layer.

In order to obtain a polycrystalline silicon layer with a greater grain diameter in such a low temperature polysilicon process, the method of irradiating the silicon layer with the laser light or electron beam is important. In the low temperature polysilicon process at present, a multi-shot irradiation method is widely used. In the multi-shot irradiation method, the laser beam is scanningly radiated onto the silicon layer, and the same portion of the silicon layer is irradiated with laser at least two times, typically, 10 to 20 times. By this, it is known that, for example, in the case of a silicon layer having a thickness of 50 nm, a polycrystalline silicon layer with a grain diameter of 0.1 to 5 $\mu$m, typically, about 0.3 to 1 $\mu$m is obtained.

Other than the low temperature polysilicon process applying the multi-shot irradiation method mentioned above, there is known a sequential lateral solidification method (hereinafter referred to as SLS method) as reported, for example, in Applied Physics Letters, vol. 69, pp. 2864 to 2866 (1996). FIG. 13 shows an outline of a treatment of a semiconductor thin film by the SLS method. In the method shown in the figure, first, a laser beam H oscillated from a laser light generating means 1 is made to be incident on a mask 6 having a periodic light-dark pattern, by use of optical means 2 to 5 such as lenses and reflectors. The laser beam H transmitted through the mask 6 is radiated onto a silicon layer on the surface of a substrate W mounted on a stage 9 through a focusing lens 7 and a reflector 8, whereby the silicon layer is perfectly melted in a width of several $\mu$m. At the time of cooling, crystals are grown laterally from peripheral portions toward the inside of the melting regions, and stripe form lateral growth regions are obtained. Next, the mask 6 or the stage 9 with the substrate W mounted thereon is mechanically moved by a distance not more than the width of the melting regions, typically, about 0.75 $\mu$m, and then lateral growth is caused similarly to the above. It is reported that by such a method, it is possible to obtain an elongate polycrystalline silicon thin film which is uniform over a wide area and has grain boundaries parallel to the scanning direction.

Further, as an example of application of the SLS method, Japanese Patent Laid-open No. 2000-150412 discloses a method in which the above-mentioned periodic light-dark pattern is formed as an interference fringe by interference of laser light. The publication also discloses the technique of changing the positions of the interference fringe and, hence, the melting positions of the silicon layer, by moving mirrors and a stepped transmissive plate disposed on the optical path of the laser light by a mechanical means.

However, in the process applying the multi-shot irradiation method, of the above-mentioned low temperature polysilicon processes, the crystal size of the polycrystalline silicon obtained (grain diameter: 0.1 to 5 $\mu$m) is extremely small as compared with the size of the thin film transistors at present (about 5 to 50 $\mu$m square). Therefore, the characteristic of the thin film transistor fabricated by use of the polycrystalline silicon is, for example, such that the electron mobility is as low as 100 $cm^2$/Vs due to carrier trap at grain boundaries of the polycrystalline silicon; thus, the thin film transistor obtained is inferior to the transistor fabricated in single-crystalline silicon.

Here, in a display system using a thin film transistor, if the characteristics of the thin film transistor in a display area are dispersed, it is recognized as dispersion of display characteristics, resulting in low display quality. The dispersion of the thin film transistor characteristics is due primarily to the dispersion of polycrystalline grain diameter, which arises from dispersion of laser energy in the polycrystallization process, specifically, dispersion on an irradiation shot basis and distribution of light intensity in the irradiation plane.

FIG. 14 shows the variation of mean grain diameter of polycrystalline silicon against laser energy in the case where the same portion is irradiated with laser light 20 times. From the figure, it is seen that where the laser energy may possibly vary by ±8%, if the laser energy exceeds the irradiation energy of 380 mJ/$cm^2$ corresponding to the maximum grain diameter even once in the 20 times of irradiation, the grain diameter is rapidly lowered, and fine crystallization occurs partly, so that it is necessary to perform irradiation at 350 mJ/$cm^2$. It is also seen that the dependency of grain diameter on laser energy is heavy and, for example, a dispersion of energy of only ±1% leads to a dispersion of grain diameter of no less than about ±10%. However, suppressing the dispersion of laser energy to, for example, within ±0.5% is difficult to achieve at present, because the pulse oscillation is performed in a short time (for example, in the case of excimer laser, the pulse width is 20 to 200 ns); accordingly, the crystal grain diameter is dispersed.

On the other hand, in the SLS method, it is possible to obtain large-grain-diameter crystals uniform over a wide area. However, since the irradiation of a semiconductor thin film with laser light is conducted through the mask 6 and the lenses 5, 7 of the focusing optical system, utilization efficiency of light energy is lowered, resulting in increases in treatment time and cost per substrate. In addition, there is need for a mechanism for correction of focusing errors due to waviness of the substrate or the like, which also leads to increase in treatment time and cost per substrate. Further, the stage on which to mount the substrate needs a movement accuracy on the order of 1 μm, so that equipment cost is high. Besides, it is difficult to enlarge the irradiation area in view of production cost of the focusing optical system and distortion of image, and, therefore, there is the problem that the treatment takes much time.

In the method of utilizing the interference of laser light as an application of the SLS method, utilization efficiency of light energy is good, but there are the following problems. Namely, in this method, at the time of varying the optical path lengths of split laser light so as to vary the positions of the interference fringe, the mirrors and the stepped transmissive plate are moved by a mechanical means. Here, in the case of using laser light which is oscillated in a pulse form, it is necessary to synchronize the displacement of the interference fringe with the oscillation frequency. However, in the method of displacing the interference fringe by moving the mirrors and the stepped transmissive plate by the mechanical means as above-mentioned, it is impossible to synchronize the movement of the mirrors and the stepped transmissive plate with the laser light oscillated in a pulse form at a high frequency, due to limitations as to the moving velocity and movement accuracy of the mirrors and the stepped transmissive plate. Therefore, it is difficult to perform a treatment by applying pulse-oscillated laser light at a high frequency of more than 10 kHz, such as the laser light oscillated from a pulse oscillation solid laser based on laser diode excitation, and this difficulty hampers an increase in the speed of treatment of a semiconductor thin film.

SUMMARY OF THE INVENTION

It is an object of the present invention to provide a laser irradiation apparatus capable of moving at a high frequency a light pattern formed by an interference action of laser light and thereby contriving an increase in the speed of treatment with the laser light, and a method of treating a semiconductor thin film by which it is possible to perform at a high speed a treatment for obtaining large-grain-diameter polycrystalline silicon with excellent uniformity of grain diameter by use of the laser irradiation apparatus.

In order to obtain the above object, in accordance with one aspect of the present invention, there is provided a laser irradiation apparatus, including a laser light generating means, a splitting means for splitting the laser light generated from the laser light generating means into a plurality of beams, a light interference means for causing the beams split by the splitting means to interfere with each other to form a periodic light pattern, and a phase shifting means for electro-optically shifting the phase of at least one of the plurality of beams split by the splitting means.

In the laser irradiation apparatus thus constituted, the laser light generated from the laser light generating means is split by the splitting means into a plurality of beams, which are caused by the light interference means to interfere with each other, thereby forming a periodic light pattern. Therefore, it is possible to generate a light pattern with utilization efficiency of laser light energy maintained at a higher value, as compared with the case of forming a light pattern by use of a mask. In addition, since the phase shifting means for shifting the phase of at least one of the beams split from the laser light is provided, it is possible to optically move the light pattern formed by interference. Besides, since the phase shifting means is for electro-optically shifting the phase, optical movement of the light pattern can be performed at a high frequency. As a result, it is possible to contrive an increase in the speed of treatment. Therefore, it is possible to contrive a reduction in treatment time in treating a semiconductor thin film with laser light. Further, since it is possible to shift the phase at a high frequency synchronized with the laser light generating means for pulse oscillation at a high frequency, it is possible to use a laser light generating means in which the life of an excitation light source is long but the repeated pulse oscillation frequency is high, such as, for example, a pulse oscillation solid laser based on laser diode excitation. Therefore, in the laser irradiation apparatus for performing a treatment by optically moving the light pattern, it is possible to build up an apparatus which can operate continuously for a long time and which is high in reliability.

In accordance with another aspect of the present invention, there is provided a method of treating a semiconductor thin film including the steps of irradiating the semiconductor thin film with a periodic light pattern generated by interference of a plurality of beams split from laser light, thereby partially melting the semiconductor thin film, and thereafter moving the light pattern in the arrangement direction of the light pattern within the range of the period thereof, wherein the movement of the light pattern is carried out by electro-optically shifting the phase of at least one of the split beams.

In the treating method, at the time of shifting the phase of the beam for optically moving the light pattern formed by interference of the split beams, so as thereby to obtain large-grain-diameter polycrystalline silicon with excellent uniformity of grain diameter, the phase of the beam is shifted electro-optically, so that the optical movement of the light pattern is performed at a high frequency. Therefore, a treatment by moving the light pattern at a high speed is conducted, and the speed of treatment is enhanced. Therefore, the treatment time in treating the semiconductor thin film for obtaining large-grain-diameter polycrystalline silicon with excellent uniformity of grain diameter can be shortened.

DESCRIPTION OF THE PREFERRED EMBODIMENTS

Figure 1:
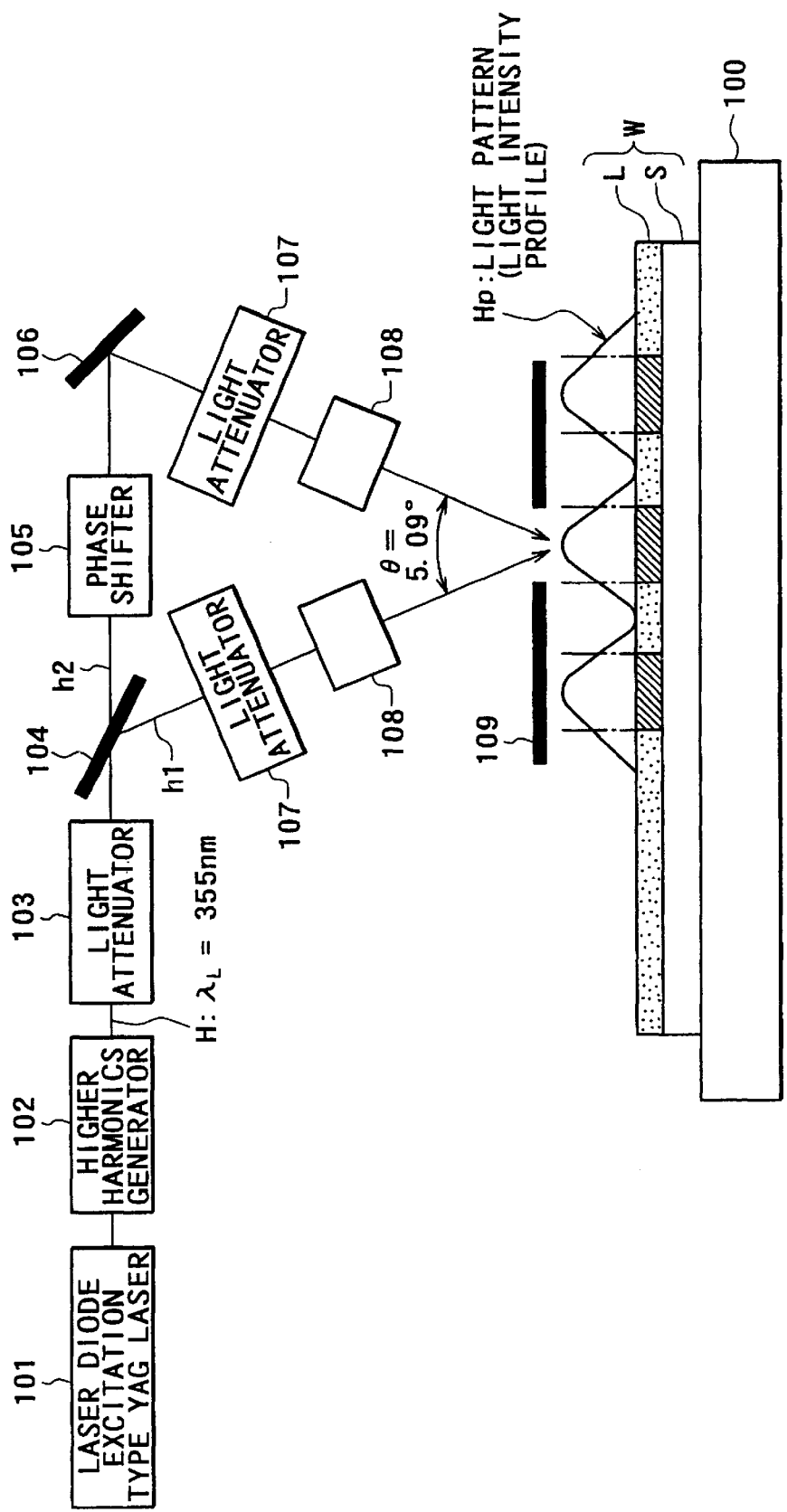
FIG. 1 is a diagram showing the constitution of a laser irradiation apparatus according to First Embodiment.

Hereinafter, embodiments of a laser irradiation apparatus and a method of treating a semiconductor thin film according to the present invention will be described in detail below referring to the drawings.

[First Embodiment]
Laser Irradiation Apparatus

FIG. 1 is a diagram showing the constitution of one example of the laser irradiation apparatus according to the present invention. The laser irradiation apparatus shown in the figure is used, for example, for a treatment for crystallizing a semiconductor thin film.

The laser irradiation apparatus shown in the figure includes a laser light generation means 101 consisting of a laser diode excitation type YAG laser. The laser light generation means 101 generates laser light H at a repeated pulse oscillation frequency of about 1 to 100 kHz. As the laser light generation means 101, one provided with an injection seeder is preferably used, for enhancing interference properties. In addition, it is preferable to use a YAG laser having a top hat type beam profile so that a uniform light intensity profile can be obtained in the irradiation region. As such a laser light generation means 101, for example, a system obtained by fitting an injection seeder to 210-UV series, a product by Lightwave Electronics, can be used.

A higher harmonics generator 102 is disposed in the emission direction of the laser light H generated by the laser light generation means 101. The higher harmonics generator 102 is comprised of $LiB_3O_5$ (LBO) or $BaB_2O_4$ (BBO) crystal, and converts the fundamental wave (wavelength: 1064 nm) of the laser light H generated from the laser light generation means 101 to the third harmonic (wavelength: 355 nm). By this, the laser light H after the wavelength conversion has a pulse width of about 30 ns, and energy per pulse of 0.6 mJ (at the time of 10 kHz oscillation).

In the emission direction of the laser light H transmitted through the higher harmonics generator 102, a transmittance-variable light attenuator 103 and a beam splitter 104 as a splitting means for splitting the laser light are sequentially arranged. The beam splitter 104 splits the laser light H into two beams at an intensity ratio of about 1:1, reflects a first beam h1 thus split, and transmits a second beam h2 thus split.

A phase shifting means 105 is disposed in the transmission direction of the beam splitter 104. The phase shifting means 105 is such that the phase of the light transmitted therethrough is freely variable by utilizing an electro-optical effect. As such a phase shifting means 105, there are those using the crystal of $KH_2PO_4$ (potassium dihydrogenphosphate: KDP), $NH_4H_2PO_4$ (ammonium dihydrogenphosphate: ADP), $LiTaO_3$, $LiNbO_3$, $Ba_2NaNb_5O_{15}$ or the like, as well known. These crystals can provide the laser beam transmitted through the crystal with a phase retardation according to the voltage impressed thereon.

Here, in order to prevent a disturbance from being generated in the light intensity profile of the laser light radiated from the laser irradiation apparatus due to the arrangement of the phase shifting means 105, the crystal used for the phase shifting means 105 is a KDP crystal polished with high accuracy which provides a phase retardation of 360° at an impressed voltage of 1500 V so that the wave front distortion at the time of transmission of the second beam h2 will be not more than $\lambda/10$ (35 nm).

In addition, a reflector 106 is disposed on the optical path of the second beam h2 transmitted through the phase shifting means 105. The reflector 106 is arranged as a light interference means; namely, the reflector 106 reflects the second beam h2 transmitted through the beam splitter 104 so that the second beam h2 intersects with the first beam h1 reflected by the beam splitter 104 at a predetermined angle, whereby the first beam h1 and the second beam h2 are superposed and interfere with each other to generate a periodic light pattern (here, an interference fringe).

Here, the predetermined angle θ at the time of intersection of the first beam h1 and the second beam h2 is set as follows. Namely, the period P of the interference fringe generated when two laser beams with a wavelength λ are incident on a substrate surface at an included angle θ (radian) is given by the formula:

$$P = \lambda / \{2 \sin(\theta/2)\}.$$

From the formula, it is seen that when an interference fringe with a period of 4.0 μm is to be generated on the surface of the substrate W in the case where λ=355 nm, the included angle is θ=5.09°. Accordingly, the reflector 106 is so set as to reflect the second beam h2 so that the second beam h2 intersects with the first beam h1 reflected by the beam splitter 104 at an included angle θ=5.09°.

In addition, a stage 100 on which to mount the substrate W to be treated is arranged in the reflection direction of the reflector 106 and the reflection direction of the beam splitter 104. Here, such a setting is made that the periodic light pattern (here, the interference fringe) Hp generated by superposition and interference of the first beam h1 and the second beam h2 is radiated onto the surface of the substrate W mounted on the stage 100. The stage 100 is, for example, an by movable stage of the stepping motor drive type.

Transmittance-variable light attenuators 107 are disposed respectively on the optical path of the first beam h1 and the optical path of the second beam h2. These light attenuators 107 are used by adjusting the transmittances thereof so that the contrast ratio of the light pattern Hp radiated onto the surface of the substrate W is maximized.

Optical systems 108 each comprised of cylindrical convex and concave lenses are disposed in the emission directions of the light attenuators 107, and, further, an orifice (diaphragm) 109 is disposed on the optical paths of the first beam h1 and the second beam h2 transmitted through these optical systems 108 so that the light pattern Hp formed by the first beam h1 and the second beam h2 transmitted through the orifice 109 is radiated onto the substrate W.

These optical systems 108 and the orifice 109 are provided so as to shape the irradiation region of the light pattern Hp relative to the surface of the substrate W. Particularly, here, it is preferable to selectively shape the irradiation region so that the variations in light intensity will be within the range of ±20%. Accordingly, for example, where the 210-UV series produced by Lightwave Electronics is used as the laser light generation means 101, the region of 0.21 mm×0.21 mm in a central portion of the laser light generated is selected as the irradiation region.

Figure 13:
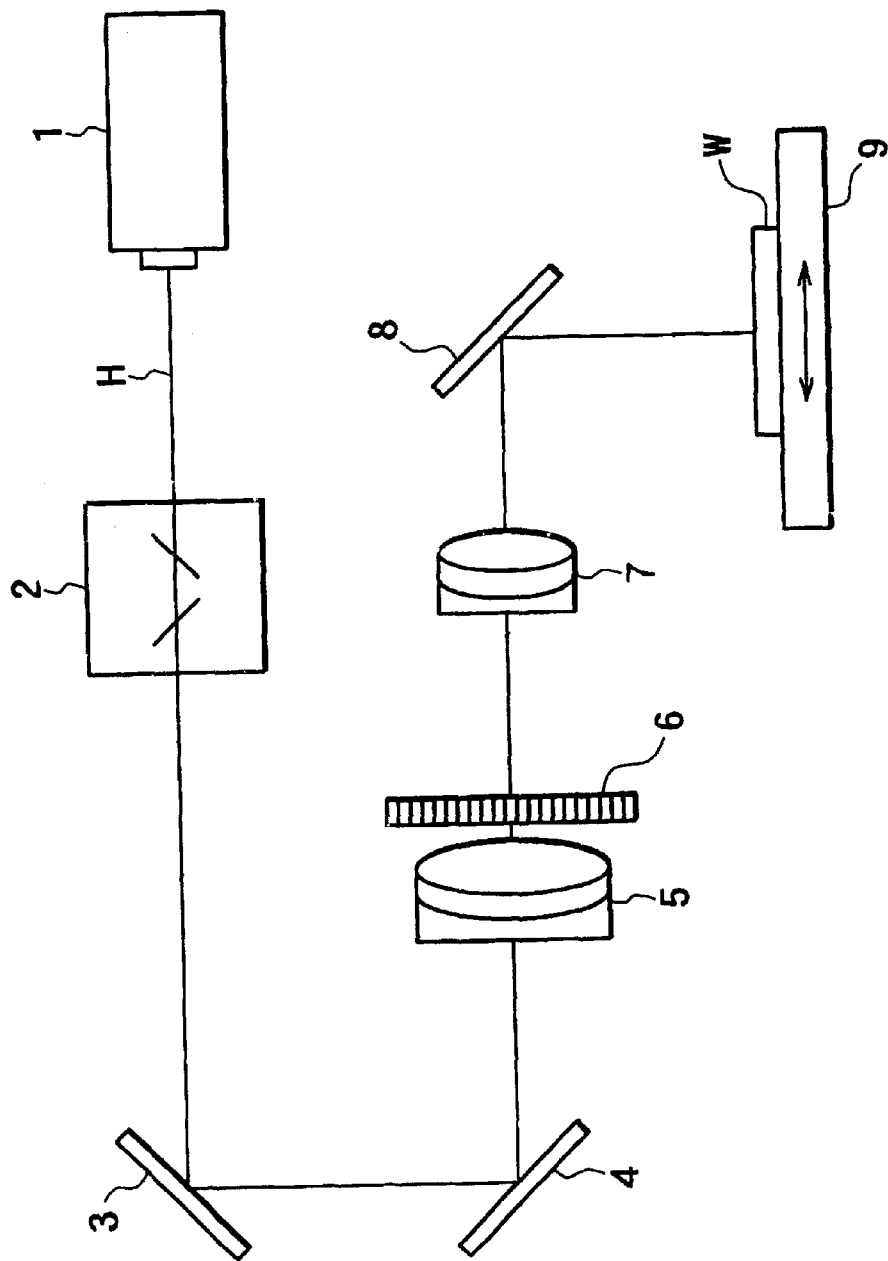
FIG. 13 is a constitutional diagram showing an outline of the treatment of a semiconductor thin film by a conventional SLS method.
Figure 14:
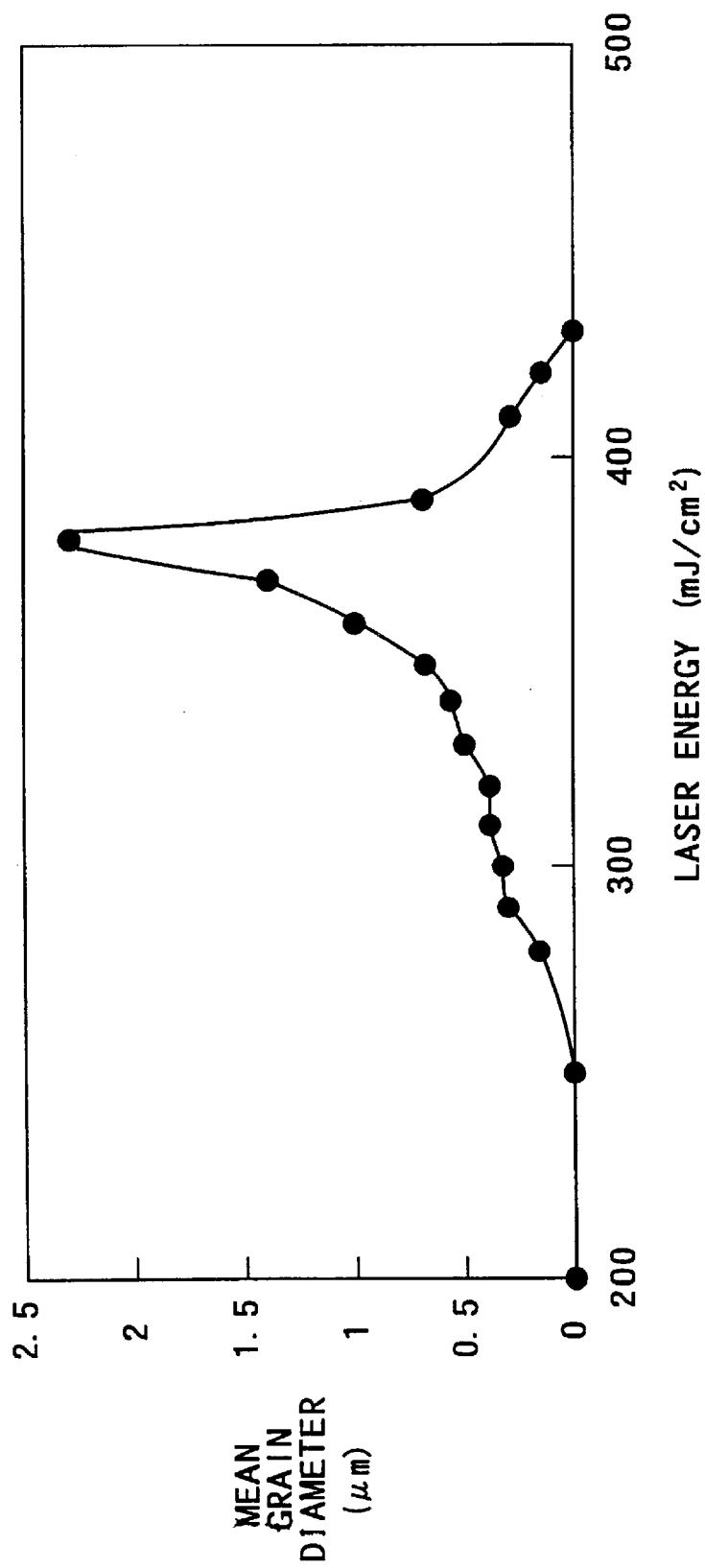
FIG. 14 is a graph showing the relationship between laser energy and mean grain diameter of polycrystalline silicon.

In the laser irradiation apparatus constituted as above, the laser light H generated by the laser light generation means 101 and the higher harmonics generator 102 is split by the beam splitter 104, the second beam h2 of the two split beams is reflected by the reflector 106 to interfere with the first beam h1, whereby the periodic light pattern (interference fringe) Hp is formed, and it is radiated onto the surface of the substrate W on the stage 100. Therefore, the light pattern Hp with utilization efficiency of laser light energy maintained to be higher can be generated and radiated onto the substrate W, as compared with the case of the related art where a similar light pattern formed by use of a mask is radiated onto the substrate W as has been described referring to FIG. 13.

In addition, since the phase shifting means 105 for shifting the phase of the second beam h2 is provided, the light pattern generated through interference can be optically moved on the stage 100. The movement can be performed within the range of high precision shorter than the period of the light pattern Hp generated through interference. On the other hand, in the case where a similar light pattern formed by use of a mask is similarly moved on the stage, it is necessary to perform a mechanical movement by driving the stage 100, and the stage 100 must be provided with a driving system with high precision, so that equipment cost is raised. Therefore, in the apparatus according to the present embodiment, the stage 100 provided as an xy movable stage of the stepping motor drive type is not required to perform high-precision movements, so that a reduction in equipment cost can be realized.

Besides, while the apparatus using a mask needs to have a focusing optical system, the apparatus of the present embodiment does not need a focusing optical system and does not need lenses other than those for beam shaping. Therefore, even where a short wavelength laser such as the fourth harmonic (wavelength: 266 nm) of YAG laser, an XeCl excimer laser (wavelength: 308 nm) and a KrF ecimer laser (wavelength: 248 nm) is used as a light source, the apparatus of the present embodiment does not need special lenses; therefore, equipment cost can be reduced, and scale-up can be easily realized.

Particularly, since the phase shifting means 105 used in the present embodiment is one for shifting the phase electro-optically, the shifting of phase can be performed at a high frequency, namely, the optical movement of the light pattern Hp can be performed at a high frequency. Therefore, in the case of irradiating the surface of the substrate W with the light pattern Hp while optically moving the irradiation position of the light pattern Hp, it is possible to optically move the irradiation position of the light pattern Hp at a higher speed, and to contrive a reduction in treatment time.

In addition, since the phase can be thus shifted at a high speed, it is possible to shift the phase synchronously with laser light of the pulse oscillation type with a high oscillation frequency. Therefore, it is possible to use a laser light generation means 101 with a high oscillation frequency such as a laser diode excitation type YAG laser. The laser diode excitation type YAG laser has a life at the time of continuous use of not less than 10,000 hr (10 kHz). This life is longer by not less than one order, as compared with the lamp replacement period of a flash lamp excitation Q switch pulse oscillation solid laser of 500 hr (10 kHz), so that it is possible to build up a laser irradiation apparatus with high reliability which can be operated continuously for not less than one year.

In the above, description has been made of the constitution in which the phase shifting means 105 for shifting the phase of the beam electro-optically is disposed on the optical path of the second beam h2 between the beam splitter 104 and the reflector 106. However, the phase shifting means 105 can be disposed at any position on the optical path of the first beam h1 or on the optical path of the second beam h2, without any particular limitation, whereby the same effect as above can be obtained.

In addition, as the means for generating the light pattern Hp (light interference means), an interferometer such as Michelson interferometer and Fizeau interferometer may be used. In this case, by providing the above-mentioned electro-optical phase shifting means on the optical path of the split beam in each of these interferometers to constitute a laser irradiation apparatus, it is possible to perform a high-speed treatment in the same manner as by the laser irradiation apparatus shown in FIG. 1 described above.

Besides, in the above description, the optical systems 108 each comprised of cylindrical convex and concave lenses and the orifice 109 have been provided for shaping the irradiation region of the light pattern generated through interference. When non-spherical lens type or non-spherical mirror type optical systems are used as the optical systems 108, it is possible to uniformize to a certain extent the laser light H with a Gaussian profile and to further enhance the utilization efficiency of laser light energy.

In the above, since it has been an object to optically move the light pattern Hp at a high frequency, description has been made of the case where the laser diode excitation type YAG laser is used as the laser light generation means 101. However, a flash lamp excitation type Q switch YAG laser may also be used as the laser light generation means 101.

Method of Treating a Semiconductor Thin Film

Next, as a method of treating a semiconductor thin film according to the present invention, a treating method in the case of crystallizing an amorphous silicon thin film (semiconductor thin film) by use of the laser irradiation apparatus described referring to FIG. 1 will be described.

First, a substrate W including an amorphous silicon thin film L formed on a glass substrate S is prepared. The amorphous silicon thin film L is, for example, formed on the glass substrate S through a silicon nitride ($SiN_x$) film and a silicon oxide ($SiO_2$) film which are not shown here, according to the constitution of a thin film transistor to which the method of treating a semiconductor thin film is applied.

The formation of these films is conducted, for example, by the so-called plasma CVD (chemical vapor deposition) method or other CVD method in which raw material gases are introduced into a vacuum film formation chamber in which the glass substrate is contained, and glow discharge is caused between parallel flat plate electrodes on which rf power with a frequency of 13.56 MHz is impressed, thereby decomposing the mixture gas and building up the desired film, according to the steps for fabricating a thin film transistor.

Here, in the case where the film formation is conducted by the plasma CVD method, first, the glass substrate S is contained in the vacuum film formation chamber, and the glass substrate S is preliminarily heated (for example, 400° C.). Silane gas ($SiH_4$) and ammonium gas ($NH_3$) as raw material gases are introduced at a pressure of 100 Pa into the vacuum film formation chamber, whereby an $SiN_x$ film is built up in a thickness of 100 nm on the glass substrate. Next, silane gas and oxygen ($O_2$) as raw material gases are introduced, whereby an $SiO_2$ film is built up in a thickness of 200 nm on the $SiN_x$ film. Thereafter, only the silane gas is introduced at a pressure of 150 Pa, whereby a hydrogenated amorphous silicon thin film L is built up in a thickness of 30 to 300 nm, typically 50 nm, on the $SiO_2$ film. The amount of hydrogen in the amorphous silicon thin film L in terms of atomic ratio is about 2%.

The amorphous silicon thin film L formed in the manner as above is polycrystallized according to the following procedure described referring to the sectional step diagram shown in FIGS. 2A to 2F.

Figure 2:
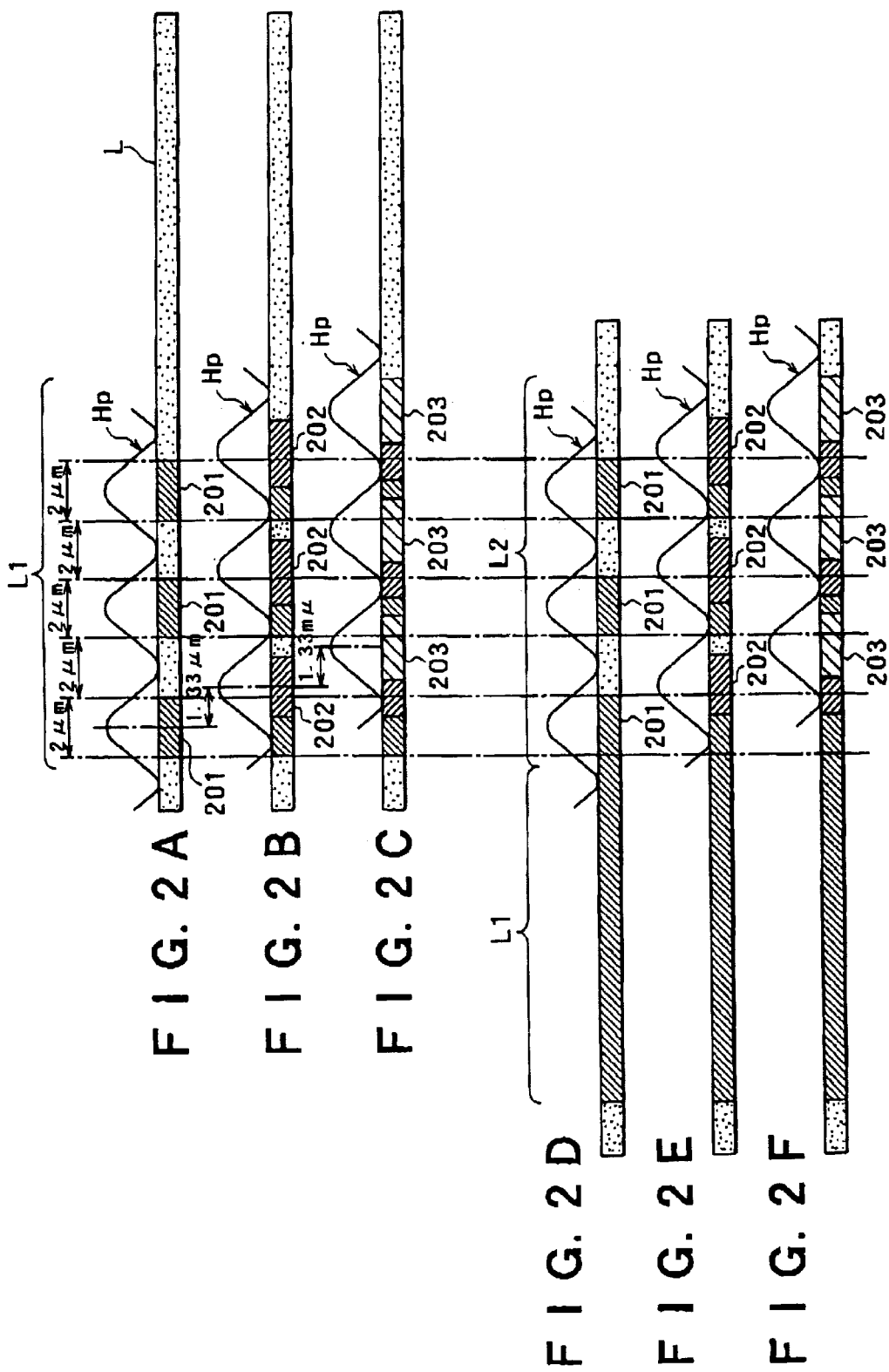
FIGS. 2A to 2F are diagrams illustrating a method of treating a semiconductor thin film according to First Embodiment.

First, by adjusting each portion of the laser irradiation apparatus shown in FIG. 1, pulse oscillation of laser light H at a frequency of, for example, 1 kHz is conducted and interference thereof is caused. Then, as shown in FIG. 2A, a light pattern Hp having a light intensity profile such that a light portion with a width of 2 µm appears at a period of 4 µm is radiated onto a first region L1 (0.2 mm×0.2 mm) of the amorphous silicon thin film L on the surface of the substrate W. By this, each of irradiation portions (light portions) with a width of 2 µm in the first region L1 of the amorphous silicon thin film L is selectively melted as the crystallization portion at the first shot 201. In this case, each of non-irradiation portions (dark portions) with a width of 2 µm is maintained at a temperature lower than the melting point of amorphous silicon by not less than 100° C. In the irradiation at the first shot 201, no voltage is impressed on the phase shifting means (105) of the laser irradiation apparatus.

During cooling after completion of the irradiation at the first shot 201, polycrystalline silicon is caused to laterally grow from the boundary portion between a molten region and an unmelted region toward the molten region. In this case, where the width of the molten regions is not more than 2 times the distance over which the crystal can laterally grow, for example, where the width of the molten regions is not more than 2 times of about 0.1 to 5 µm in the case of a silicon thin film with a thickness of 50 nm, one time of irradiation results in the formation of lateral growth regions in a stripe pattern over the entire area of the light portions. The distance over which the crystal can grow laterally depends on the pulse width and pulse shape of the laser, and increases as the thickness of the semiconductor thin film increases and as the substrate temperature rises. The lateral growth will be detailed later.

After the irradiation with laser light at the first shot 201 is conducted one time or a plurality of times as required, a voltage of 500 V is impressed on the phase shifting means (105) synchronously with the pulse oscillation of the laser irradiation apparatus. By this, as shown in FIG. 2B, the first optical primary scanning for moving the light pattern Hp by 1.33 µm in the arrangement direction thereof is performed, and irradiation at the second shot 202 with end edges overlapped with the first shot 201 is conducted. Then, at the portions at the second shot 202 in the first region L1, crystals are caused to laterally grow in the same manner as in the case of the first shot 201. In the lateral growth at the second shot 202, the laterally grown polycrystalline silicon is already present at the boundaries with the portions of the first shot 201, and lateral growth occurs with the polycrystalline silicon as seeds without any supercooling process, so that longer polycrystalline grains can be obtained as compared with the case of the first shot 201.

Thereafter, the voltage impressed on the phase shifting means (105) is changed over from 500 V to 1000 V synchronously with the pulse oscillation of the laser irradiation apparatus. By this, as shown in FIG. 2C, the second primary scanning for moving the light pattern Hp further by 1.33 µm in the arrangement direction thereof is performed, irradiation at the third shot 203 with end edges on both sides overlapped with the second shot 202 and the first shot 201 is conducted, and crystals are caused to laterally grow without any supercooling process in the same manner as in the case of the second shot 202.

By the above three shots 201 to 203 of irradiation, amorphous silicon in the first region L1 of 0.2 mm×0.2 mm of the amorphous silicon thin film L is crystallized into uniform polycrystalline silicon. The time required for this is about 3 ms, and the crystallization rate is about 0.133 $cm^2$/sec.

Figure 3:
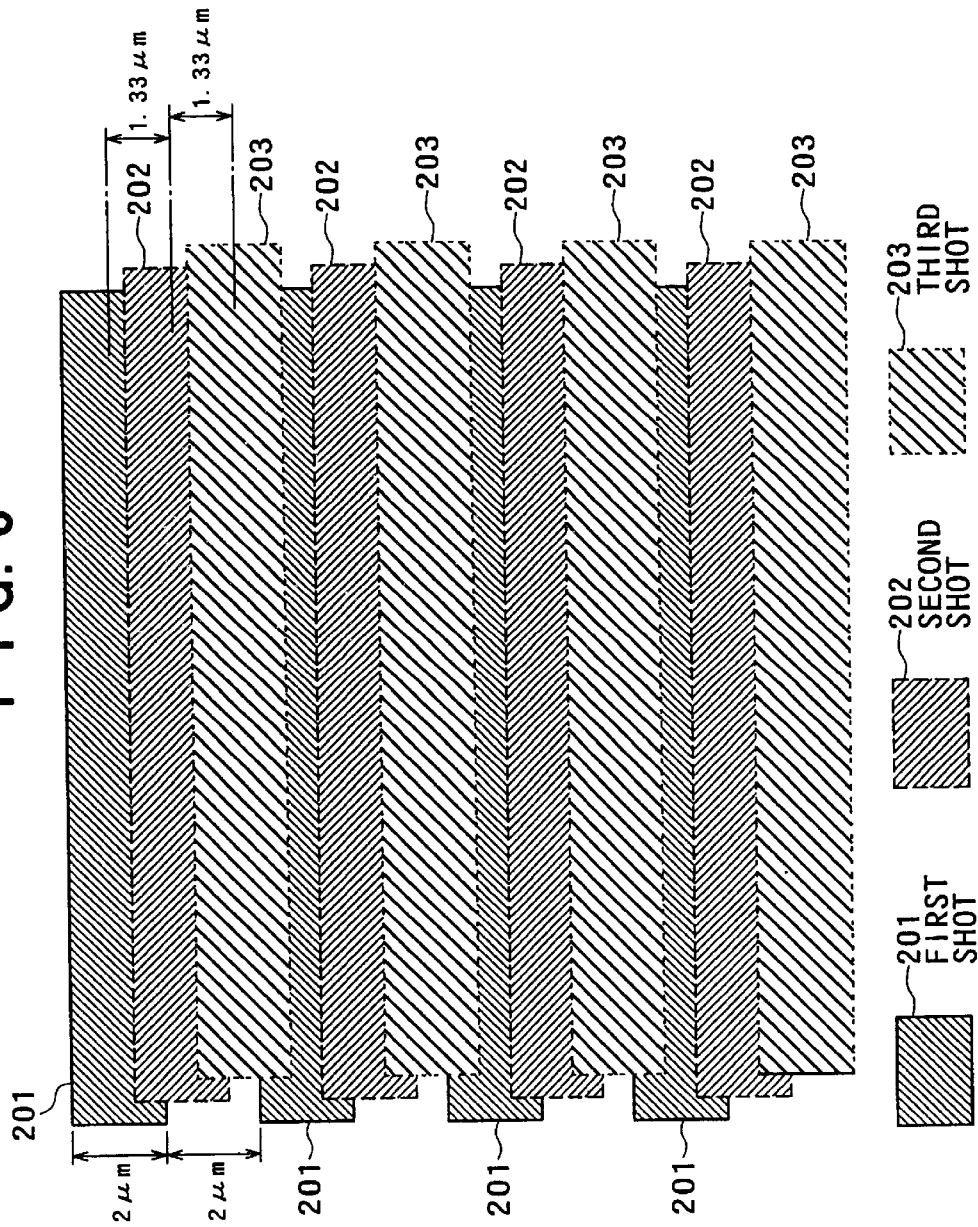
FIG. 3 is a plan view illustrating the method of treating a semiconductor thin film according to First Embodiment.

FIG. 3 is a plan view for illustrating the method of irradiation attended by the above-mentioned primary scanning, and shows that amorphous silicon in the first region L1 can be entirely melted and polycrystallized by performing the first shot 201, the second shot 202 and the third shot 203 of irradiation in the overlapping manner as described above. In FIG. 3, the shots 201 to 203 are shown in the state of being shifted in the extending direction of the light pattern (in the lateral direction in the figure), for ease of understanding.

After amorphous silicon in the first region L1 of the amorphous silicon thin film L is crystallized in the manner described above, mechanical secondary scanning is conducted as shown in FIG. 2D. Namely, the substrate W is moved by about 0.2 mm by driving the xy movable stage of the stepping motor drive type, whereby the irradiation region of the laser light by the laser irradiation apparatus is moved to the second region L2 adjacent to the first region L1 of the amorphous silicon thin film L.

Then, the second region L2 is subjected to three shots 201 to 203 of irradiation with laser light shown in FIGS. 2D to 2F, in the same manner as described above referring to FIGS. 2A to 2C. By this, amorphous silicon in the second region L2 of 0.2 mm×0.2 mm adjacent to the first region L1 is crystallized.

Subsequently, the mechanical secondary scanning by driving the stage and the electro-optical primary scanning by driving the phase shifting means are repeated, whereby a required region (for example, the whole area) of the amorphous silicon thin film L is irradiated with the light pattern Hp.

By the treating method as described above, amorphous silicon in the required region (for example, the whole area) of the amorphous silicon thin film L is crystallized, whereby a polycrystalline silicon thin film can be obtained.

Figure 4:
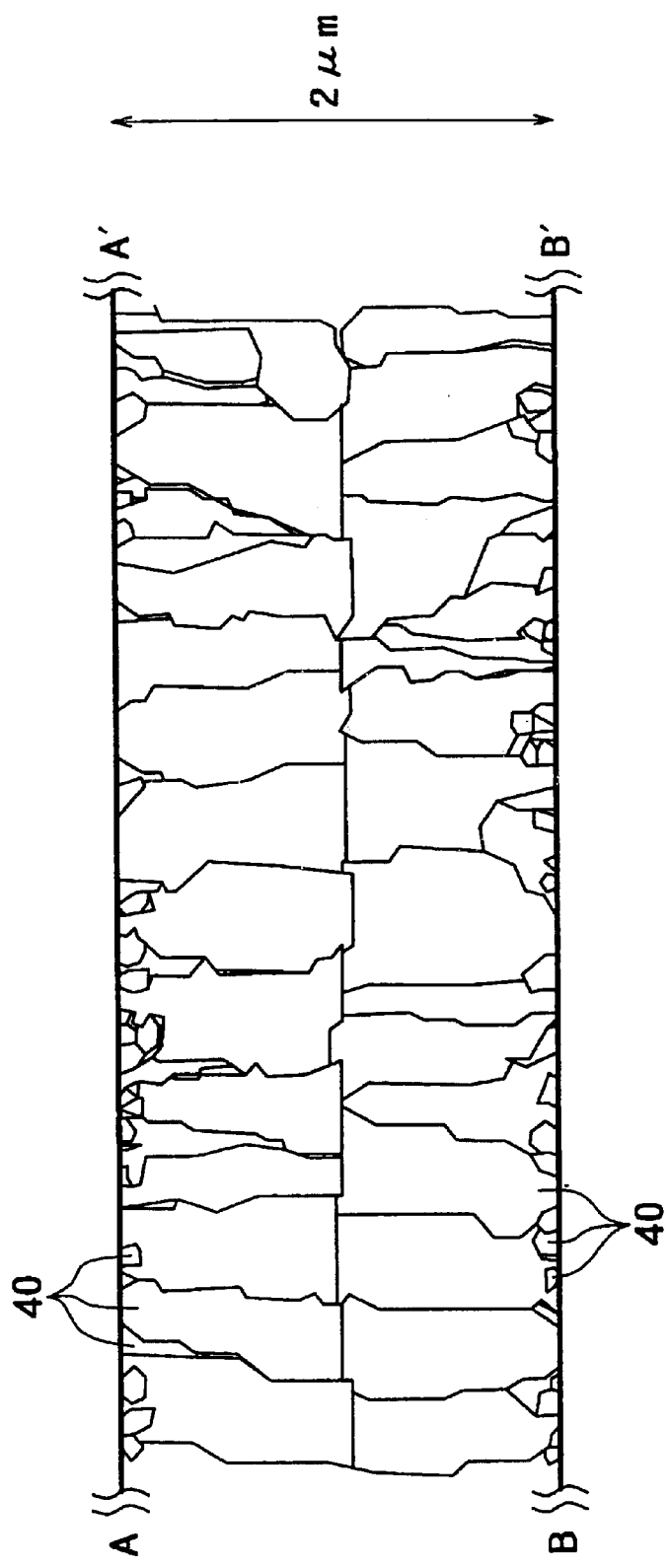
FIG. 4 is a diagram illustrating the lateral growth of silicon crystals.

FIG. 4 schematically shows an image of crystal grains 40 of a silicon thin film obtained after the amorphous silicon thin film L is irradiated with the light pattern (interference fringe) only one time by the above-described technique, observed under scanning electron microscope (SEM) after an etching (Secco etching) for making the grain boundaries visible. The blocks in the figure represent individual crystal grains 40.

As shown in the figure, each irradiation portion (light portion) with a width of 2 µm is polycrystallized through perfect melting, and the edge portions A–A' and B–B' adjacent to the dark portion are ends of melting, namely, boundary regions between a molten portion and an unmelted portion and, therefore, solidify prior to the other regions. Therefore, a large number of nuclei (crystal grains 40) are generated in the edge portions, and the crystal grains 40 with comparatively higher growth rate among these crystal grains grow preferentially, resulting in that the crystal growth is completed at the position where the crystals having grown respectively from the edges A–A' and B–B' collide with each other, namely, roughly at the center in the melting width direction, as seen from the figure.

Principally, the lateral growth occurs as follows. Namely, the portion crystallized in the initial stage liberates the latent heat of fusion ($1.6 \times 10^6$ J/kg for Si) upon solidification, thereby heating the liquid phase (unsolidified) portion in the 'off-shore' region. On the other hand, the coefficient of nucleation in the liquid phase portion is a steep function of temperature, so that nucleation is restrained by the heating from the solidified portion. As a result, the crystal growth from the solidified portion is sustained. This is a phenomenon which occurs because the thermal conductivity of liquid-phase silicon, 110 W/m·K, is overwhelmingly greater than the thermal conductivities of the underlying $SiO_2$ layer, $SiN_x$ layer and glass substrate, 1 to 2 W/m·K.

However, where the melting width is increased, in the vicinity of the center of the melting region, the dissipation of heat to the underlying $SiO_2/SiN_x$ layer and glass substrate surpasses the supply of heat from the solidified portion, so that nucleation occurs before the lateral growth of crystals arrives. Therefore, there is a limit as to the distance over which the lateral growth can occur. In the case where the substrate is not heated especially, the limit is empirically 2 to 5 $\mu$m for a silicon thin film with a thickness of 50 nm. Therefore, it is necessary to set the melting width or melting diameter to be not more than 10 $\mu$m, and, hence, set the period of the interference fringe to be not more than 20 $\mu$m.

It is unnecessary to set the melting width at just ½ of the period of the light pattern (interference fringe). For example, where the average laser light intensity in the irradiation plane is reduced, the melting width becomes less than ½ of the period of the interference fringe. In this case, only the number of times of irradiation required at the time of performing irradiation by moving or changing the laser light intensity profile at the same substrate position is increased, and no special inconvenience is generated principally.

As has been described above, according to this method of treating a semiconductor thin film, the semiconductor thin film is perfectly melted in the irradiation areas of the laser light in the light pattern, so that a predetermined polycrystallization can be achieved without dependence on laser energy dispersions of about 10 to 20%. Therefore, there is no need for special contrivance or cost for stabilization of laser energy. Accordingly, uniformity of thin film transistor characteristics is enhanced, and display characteristics are also enhanced.

Further, since the polycrystalline grains having grain boundaries parallel to the primary scanning direction predominate, in the case where this treating method is applied to the fabrication of a thin film transistor as will be described later, it is possible, by setting the direction of current flowing through the channel parallel with the grain boundaries, to reduce the influence of carrier trap at the grain boundaries and to enhance the thin film transistor characteristics. Accordingly, when the thin film transistor fabricated by application of this treating method is used for a driving circuit in a liquid crystal display panel, an EL display panel or the like, it is possible to achieve a reduction in the size of the thin film transistor and an increase in the speed of operation.

In addition, particularly, since the primary scanning for optically moving the light pattern is conducted through electro-optical shifting of phase, it is possible to achieve a high-speed movement of the light pattern through a phase shift at a high frequency. As a result, it is possible to enhance the speed of treatment of the semiconductor thin film.

[Second Embodiment]
Laser Irradiation Apparatus

Figure 5:
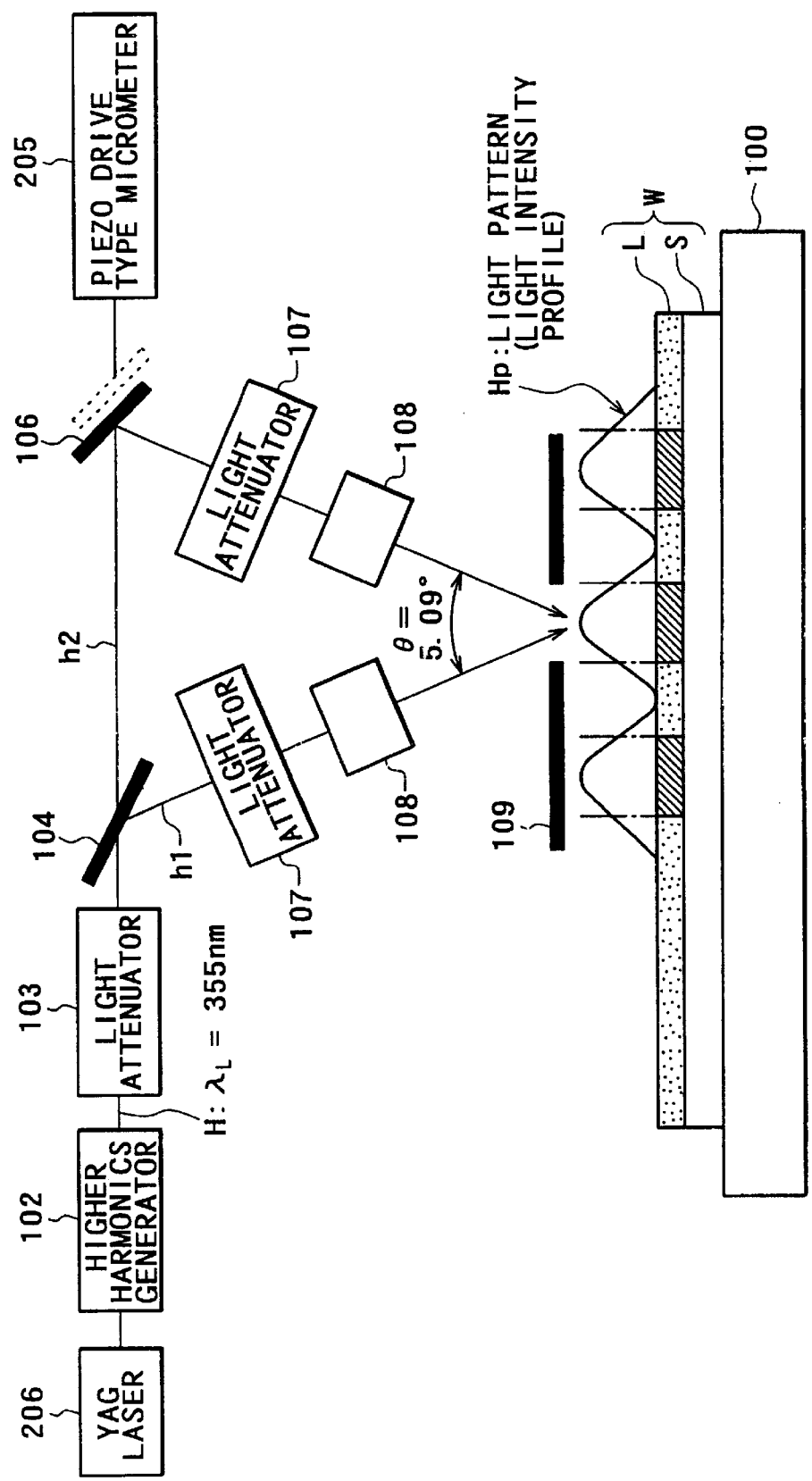
FIG. 5 is a diagram showing the constitution of a laser irradiation apparatus according to Second Embodiment.

FIG. 5 is a diagram showing the constitution of another example of the laser irradiation apparatus utilizing interference of laser light. The laser irradiation apparatus shown in the figure is used, for example, for a treatment for crystallizing a semiconductor thin film, particularly, in the case where a high-speed treatment is not needed.

The laser irradiation apparatus shown in FIG. 5 includes a mechanical phase shifting means 205, in place of the electro-optical phase shifting means (105) used in the laser irradiation apparatus according to the present invention which has been described above referring to FIG. 1.

Namely, the phase shifting means 205 is comprised of, for example, a piezo drive type micrometer for mechanically moving a reflector 106 for reflecting the second beam h2 toward the stage side. The phase shifting means 205 changes the optical path length of the second beam h2 by moving the reflector 106 relative to the incidence direction of the second beam h2. In addition, following up to this movement, the angle of the reflector 106 relative to the incidence direction of the second beam h2 is also changed so that the angle (included angle) between the first beam h1 and the second beam h2 will be a predetermined angle (for example, 5.09°). By this, the first beam h1 and the second beam h2 are made to overlap and interfere with each other, to generate a light pattern of interference fringe with good contrast.

In the laser irradiation apparatus provided with the phase shifting means 205, a laser light generation means 206 with an oscillation frequency of about 10 kHz such as, for example, a flash lamp excitation type Q switch YAG laser is used. As the laser light generation means 206, one fitted with an injection seeder is preferably used for enhancing interference properties. The pulse width of the laser light H after being converted to the third harmonic (wavelength: 355 nm) by a higher harmonics generator 102 is about 10 ns, the energy of the laser light H is 500 mJ, and dispersion of the energy is within ±7%. It is preferable to use a YAG laser having a top hat type beam profile so that a uniform light intensity profile can be obtained in the irradiation region.

The beams are so shaped that a light spot of 50 mm×2 mm is obtained on the substrate, by use of optical systems 108 each comprised of cylindrical convex and concave lenses and an orifice 109. Due to loss in these irradiation optical systems, the light intensity on the amorphous silicon thin film is about 400 mJ/cm$^2$. Each of the beams h1 and h2 is transmitted through a transmittance-variable light attenuator 107, of which the light transmittance is so adjusted that a light pattern Hp generated by interference of the beams h1 and h2 attains a maximum contrast on the surface of the substrate W. By this, a light pattern Hp having a contrast ratio of about 10:1, which is sufficient for providing the amorphous silicon thin film with a melting pattern according to the light pattern Hp (interference fringe), is formed.

In the laser irradiation apparatus constituted as above, the phase shifting means 205 is of the type in which the reflector 106 is mechanically moved. Therefore, this laser irradiation apparatus is inferior to the laser irradiation apparatus according to First Embodiment described referring to FIG. 1, in the velocity of optical movement of the light pattern Hp by shifting the phase of the second beam h2. However, the other effects can be obtained in the same manner as in the case of the apparatus according to First Embodiment.

Method of Treating a Semiconductor Thin Film

A treating method in the case of crystallizing an amorphous silicon thin film by use of the laser irradiation apparatus described above referring to FIG. 5 can be carried out following the same procedure as described in the treating method according to First Embodiment. It should be noted that, in the case of performing mechanical secondary scanning for moving the irradiation region of the laser light by the laser irradiation apparatus by moving the substrate W through driving an xy movable stage of the stepping motor drive type, the moving distance is set according to the irradiation region (50 mm×2 mm) of the laser irradiation apparatus so that no gap is generated between the individual irradiation regions.

[Third Embodiment]

Laser Irradiation Apparatus

Figure 6:
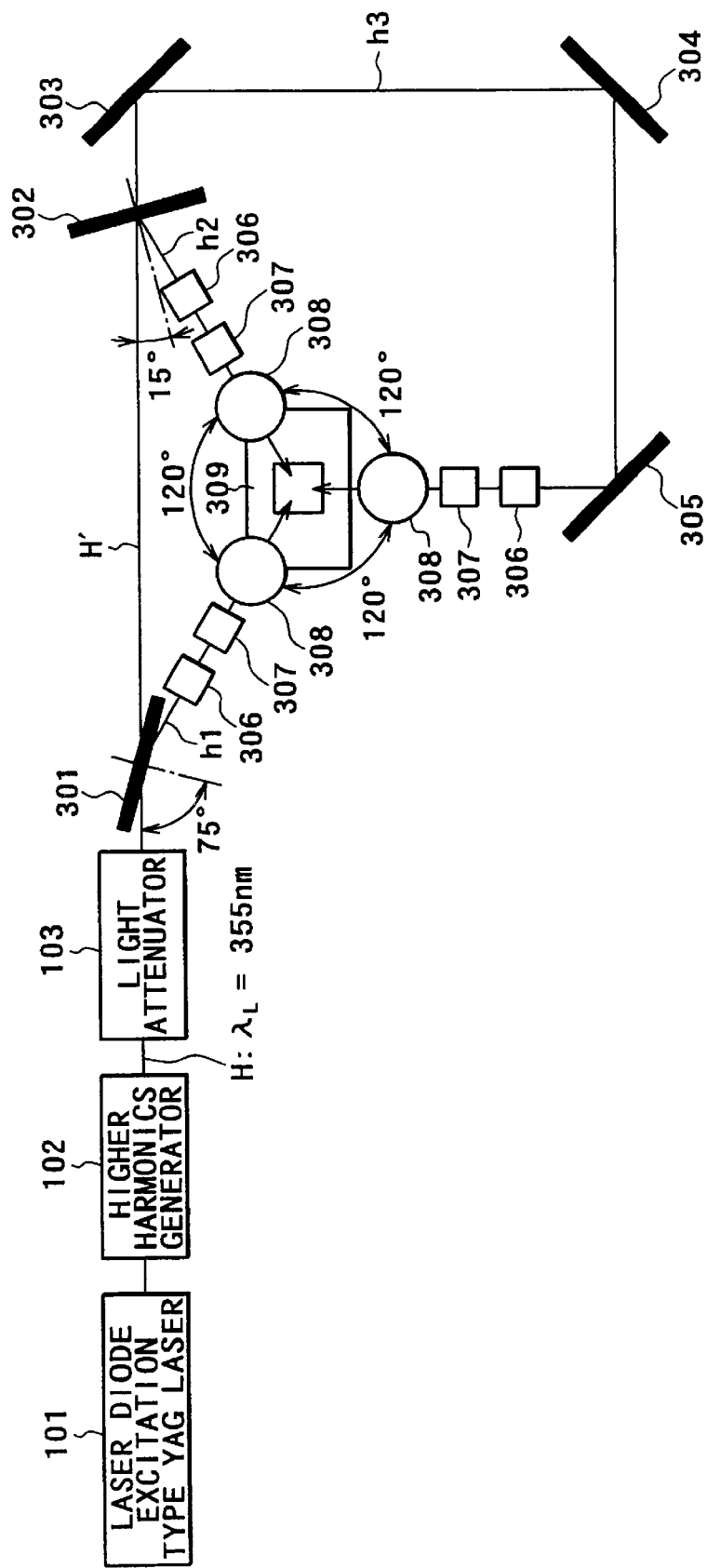
FIG. 6 is a diagram showing the constitution of a laser irradiation apparatus according to Third Embodiment.

FIG. 6 is a diagram showing the constitution of one example of the laser irradiation apparatus utilizing interference of laser light. The laser irradiation apparatus shown in the figure is used, for example, for a treatment for crystallizing a semiconductor thin film. This laser irradiation apparatus is different from the laser irradiation apparatus according to First Embodiment described referring to FIG. 1 in that laser light H generated from a laser light generation means 101 is split into three beams, which are made to interfere with each other.

Namely, the laser irradiation apparatus includes the laser light generation means 101, a higher harmonics generator 102 and a light attenuator 103, in the same manner as in First Embodiment. In the emission direction of the laser light transmitted through the light attenuator 103, a beam splitter 301 as a splitting means for splitting the laser light is disposed. The beam splitter 301 splits the laser light H into two beams, reflects the first beam h1 thus split, and transmits the remaining laser light H'. Here, the first beam h1 which is reflected and the laser light H' which is transmitted are split from each other in a ratio of 1:2.

Another beam splitter 302 is disposed in the transmission direction of the beam splitter 301. One half (½) of the laser light H' incident on the beam splitter 302 is reflected as the second beam h2, while the remaining ½ is transmitted as the third beam 3. Here, the second beam h2 and the third beam h3 are split from each other in a ratio of 1:1. Namely, the laser light generated from the laser light generation means 101 is split by the beam splitters 301 and 302 into the first beam h1, the second beam h2 and the third beam h3 in a ratio of 1:1:1.

Particularly, the beam splitter 302 is used also as an interference means by which the second beam h2 is so reflected that it intersects with the first beam h1 at an angle of 120° on a plane basis, whereby the first beam h1 and the second beam h2 are caused to overlap and interfere with each other.

On the optical path of the third beam h3 transmitted through the beam splitter 302, a required number of sheets (here, three sheets) of reflectors 303 to 305 are arranged. The reflectors 303 to 305 are so arranged that the third beam h3 transmitted through the beam splitter 302 is bent by 90° at a time on an plane basis, whereby the third beam h3 is so reflected that it intersects with the first beam h1 and the second beam h2 at an angle of 120° on a plane basis. Namely, the reflectors 303 to 305 are used as an interference means for causing the first beam h1, the second beam h2 and the third beam h3 to overlap and interfere with each other.

In order to reflect the first beam h1, the second beam h2 and the third beam h3 so that they intersect at angles of 120° on a plane basis, where the optical path of the laser light H is laid on the plane of the figure, the beam splitters 301 and 302 and the reflectors 303 to 305 are erected vertical to the plane of the figure and arranged at the following angles. Namely, the beam splitter 301 is arranged with its normal maintained at 75° relative to the incidence direction of the laser light H. The beam splitter 302 is arranged with its normal maintained at 15° relative to the incidence direction of the laser light H'. The reflectors 303 to 305 are so arranged as to bend the third beam h3 by 90° at a time relative to the incidence direction of the third beam h3.

In the incidence directions of the beam splitters 301 and 302 and the reflector 305 arranged as described above, transmittance-variable light attenuators 306 and phase shifting means 307 are disposed respectively. The light attenuators 306 and the phase shifting means 307 are the same as those in First Embodiment; particularly, the phase shifting means 307 are preferably ones for electro-optically shifting the phases of the beams h1 to h3.

Further, steering mirrors 308 are disposed respectively on the optical paths of the first beam h1, the second beam h2 and the third beam h3 transmitted through the phase shifting means 307. The steering mirrors 308 are so arranged as to refract the beams h1 to h3, which are incident to intersect at angles of 120° on a plane basis, to the same direction (for example, in the depth direction on the figure), whereby the beams h1 to h3 are incident on the substrate (not shown) on a stage disposed in the refraction direction at an incidence angle (vertical incidence angle) of about 3.5° relative to the normal to the substrate and are superposed on each other on the substrate.

Figure 7:
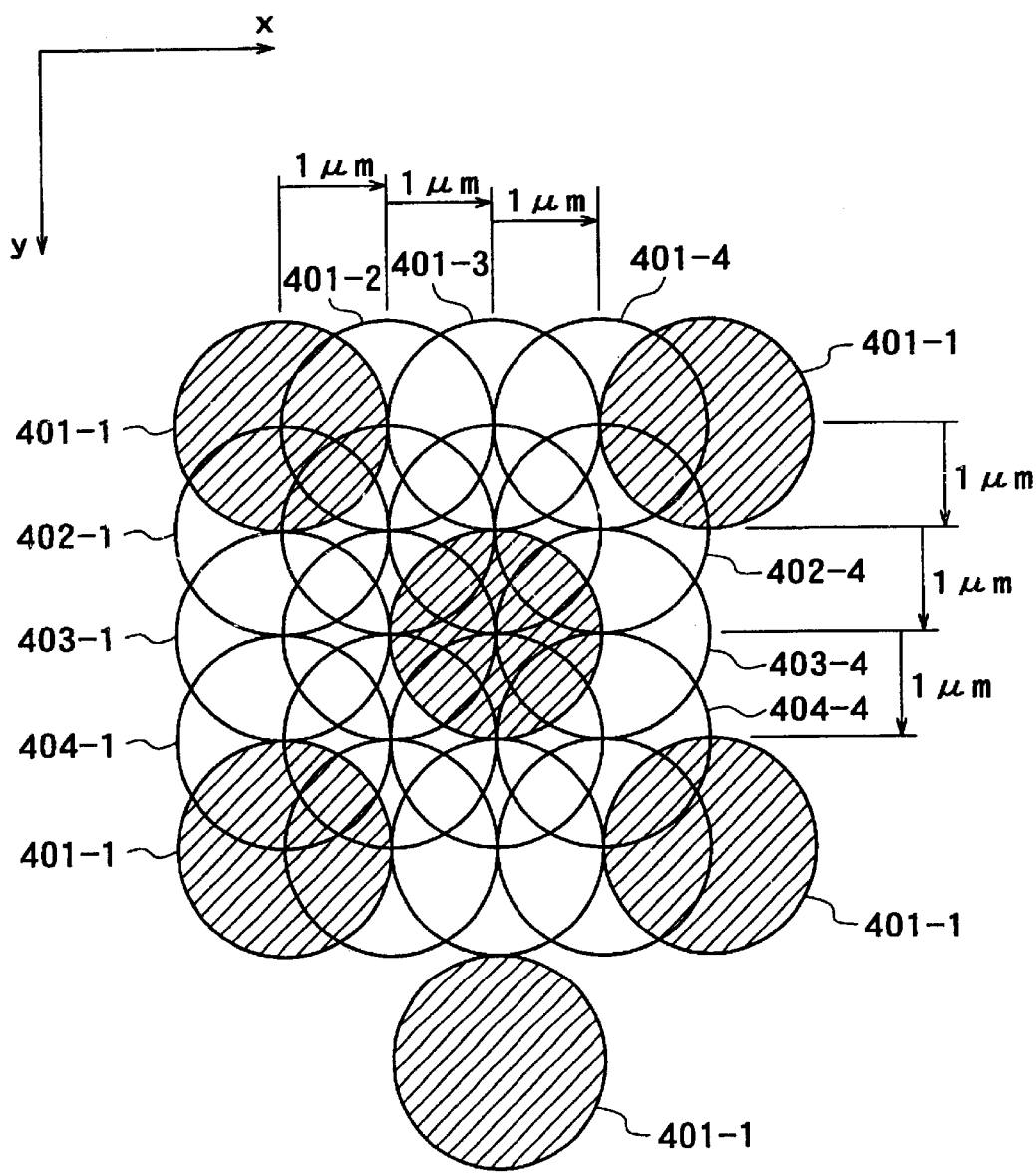
FIG. 7 is a diagram illustrating a method of treating a semiconductor thin film according to Third Embodiment.

By this, the surface of the substrate mounted on the stage is irradiated with a periodic light pattern which is formed by superposition and interference of the first beam h1, the second beam h2 and the third beam h3. Such superposition and interference of the three beams h1 to h3 generates the periodic light pattern as shown in FIG. 7. This light pattern has a light intensity profile in which circular high light intensity spots 401-1 having a diameter according to the vertical incidence angle are regularly arranged in the irradiation plane, as reported, for example, in Journal of Applied Physics, vol. 82, pp. 1497 to 1499 (1997).

In addition, as shown in FIG. 6, an orifice (diaphragm) 309 is disposed on the optical paths of the beams h1 to h3 transmitted through the steering mirrors 308 so that the beams h1 to h3 transmitted through the orifice intersect with each other on the substrate while maintaining the above-mentioned predetermined angle.

The orifice 309 is provided for shaping the irradiation region of the laser light on the surface of the substrate; here, the light spot on the substrate is shaped to be 0.5 mm×0.5 mm. Due to losses in these irradiation optical systems, the average light intensity on the substrate is about 160 mJ/cm$^2$.

The stage on which to mount the substrate and which is not shown here is disposed beneath and in proximity to the orifice 309, and is an xy movable stage of the stepping motor drive type, the same as in the laser irradiation apparatus in First Embodiment.

In the laser irradiation apparatus constituted as above, the transmittances of the light attenuators 306 inserted into the optical paths of the beams h1 to h3 are adjusted, whereby the light intensity profile of the light pattern radiated onto the surface of the substrate placed on the stage is so adjusted that the contrast ratio between the circular light portions and the other dark portions will be maximized, and the ratio can be made to be about 8:1. This contrast is sufficient for producing a melting pattern according to the light pattern in an amorphous silicon thin film formed on the surface of the substrate.

Movement of the light pattern can be achieved by impressing a DC voltage on each of the phase shifting means 307. Further, by the stepping motor drive type xy movable stage, the substrate mounted on the stage can be mechanically moved relative to the irradiation position of the light pattern.

Even in the laser irradiation apparatus constituted as above, the phase shifting means 307 are ones for electro-optically shifting the phases, as in the laser irradiation apparatus in First Embodiment, so that it is possible to shift the phases at a high frequency, namely, to perform optical movements of the light pattern at a high frequency. Besides, the other effects can be obtained in the same manner as in First Embodiment.

Method of Treating a Semiconductor Thin Film

A treating method for crystallizing an amorphous silicon thin film by use of the laser irradiation apparatus described above referring to FIG. 6 can be carried out following the same procedure as described in the treating method of First Embodiment. It should be noted here that, while the optical movement (primary scanning) of the light pattern in the same irradiation region has been in one direction in the arrangement direction of the interference fringe in First Embodiment, it is preferable to move in at least two directions in the case of using this laser irradiation apparatus.

In concrete, four shots (401-1 to 401-4) of irradiation are conducted while moving (primary scanning) by 1.0 μm step in the x direction in the irradiation region, then a movement by 1.0 μm step in the y direction is conducted, and at this position, four shots (402-1 to 402-4) of irradiation are conducted while moving (primary scanning) by 1.0 μm step in the −x direction; thus, the primary scanning in the x direction (or the −x direction) and the primary scanning in the y direction are repeated, and a total of 16 shots of irradiation are conducted in the irradiation plane. FIG. 7 is a plan view illustrating the irradiation method attended by the primary scanning, in which only the first shot 401-1 is shown by six spots, while the second to sixteenth shots are each shown by only one spot. By this, amorphous silicon in the irradiation region of 0.5 mm×0.5 mm is uniformly polycrystallized in about 0.02 sec.

Subsequently, the substrate provided with the amorphous silicon thin film is mechanically moved by 0.5 mm (secondary scanning) by the stepping motor drive type xy movable stage, and polycrystallization of the adjacent region is conducted. Then on, similarly, irradiation with laser attended by the optical movement of the light pattern (primary scanning) and the mechanical movement of the substrate (secondary movement) is repeated, to thereby crystallize amorphous silicon into polycrystalline silicon over the whole area of the substrate.

In the treating method of Third Embodiment as above, the irradiation portions (light portions) of the light pattern are circular, so that grain boundaries of the polycrystalline silicon are substantially uniformized in all directions in the irradiation plane. By this, as will be described next, when a thin film transistor, for example, is fabricated by use of the polycrystalline silicon thin film obtained by the above-mentioned treatment, it is possible to suppress dispersion of characteristics depending on the fabrication direction of the thin film transistor. Namely, where the grain boundaries are oriented in only one direction, there arises characteristic anisotropy such that the influence of grain boundary default is smaller and the characteristics of the thin film transistor are higher in the case where the direction of current flowing through the channel of the thin film transistor is parallel to the grain boundaries of polycrystalline silicon than in the case where the current direction is perpendicular to the grain boundaries. On the other hand, where the grain boundaries of polycrystalline silicon are oriented in all directions, the anisotropy can be obviated. As a result, as will be described later, when the thin film transistor is applied to a driving circuit in a liquid crystal display panel or an EL display panel, there can be obtained the effect that the direction of the channel can be laid out freely.

<Method of Fabricating Thin Film Transistor-1>

Now, a first example of a method of fabricating a thin film transistor by application of the method of treating a semiconductor thin film described above will be described below. Here, as the first example, a method of fabricating a bottom gate type thin film transistor will be described referring to FIGS. 8A and 8B. While a method of fabricating an N channel type thin film transistor is shown here, the method can be applied in the same manner to a P channel type thin film transistor by only changing the impurity species (dopant species).

Figure 8A:
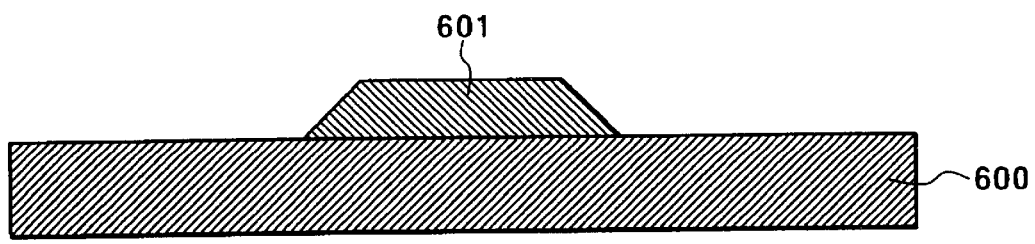
FIGS. 8A and 8B are sectional step diagrams (No. 1) illustrating a first example of a method of fabricating a thin film transistor by application of the method of treating a semiconductor thin film according to the present invention.

First, as shown in FIG. 8A, a layer of Al, Ta, Mo, W, Cr, Cu or an alloy of these elements is formed in a thickness of 30 to 300 nm on an insulating substrate 600 formed of a glass or the like, and patterning is conducted to form a gate electrode 601.

Figure 8B:
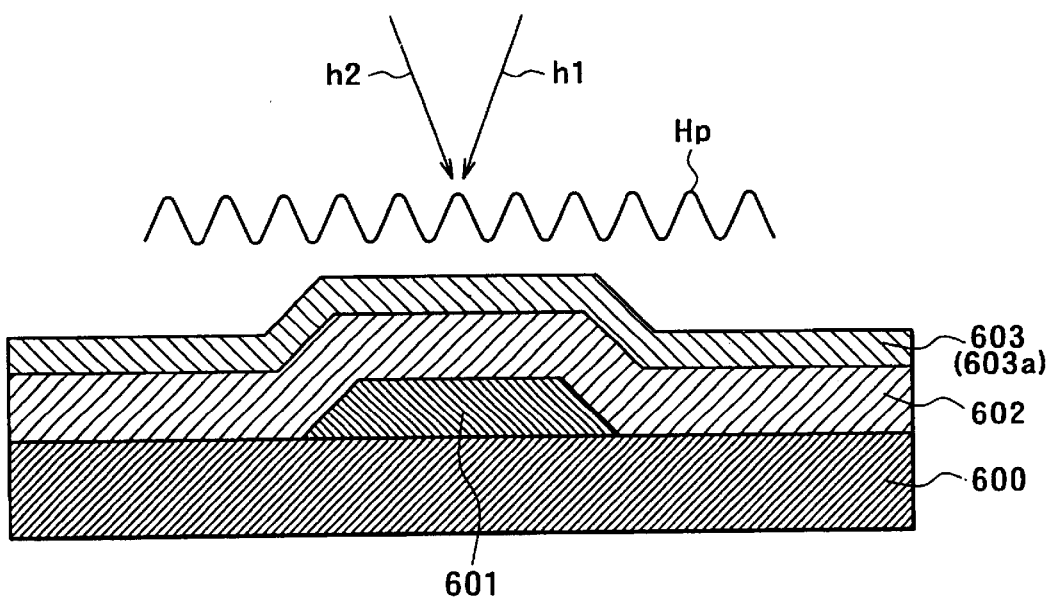

Next, as shown in FIG. 8B, a gate insulation film 602 is formed on the insulating substrate 600 in the state of covering the gate electrode 601, and, further, an amorphous silicon thin film 603 is formed on the gate insulation film 602. The gate insulation film 602 has a two-layer structure consisting, for example, of a gate nitride film ($SiN_x$) as a lower layer and a gate oxide film ($SiO_2$) as an upper layer.

The formation of each of these films is conducted by the method described in the method of treating a semiconductor film in First Embodiment, continuously while maintaining a vacuum condition in a vacuum film formation chamber. For example, by a plasma CVD method, the gate nitride film is built up in a thickness of 50 nm, and then the gate oxide film is built up in a thickness of about 100 to 200 nm to form the gate insulation film 602, followed continuously by building up the amorphous silicon thin film 603 in a thickness of about 30 to 80 nm. Where the formation of these films is conducted by the plasma CVD method, after the film formation a heat treatment is conducted at a temperature of 400 to 450° C. in a nitrogen atmosphere for about 1 hr, to release hydrogen contained in the amorphous silicon thin film 603. Namely, the so-called dehydrogenation annealing is conducted.

After the amorphous silicon thin film 603 is formed on the gate insulation film 602 in the above-described manner, the method of treating a thin film semiconductor substrate as described above (for example, the treating method of First Embodiment) is applied to the amorphous silicon thin film 603; namely, the amorphous silicon thin film 603 is irradiated with a light pattern Hp generated by interference of split laser beams h1 and h2, whereby the amorphous silicon thin film 603 is crystallized to form a polycrystalline silicon thin film 603*a*.

Figure 9A:
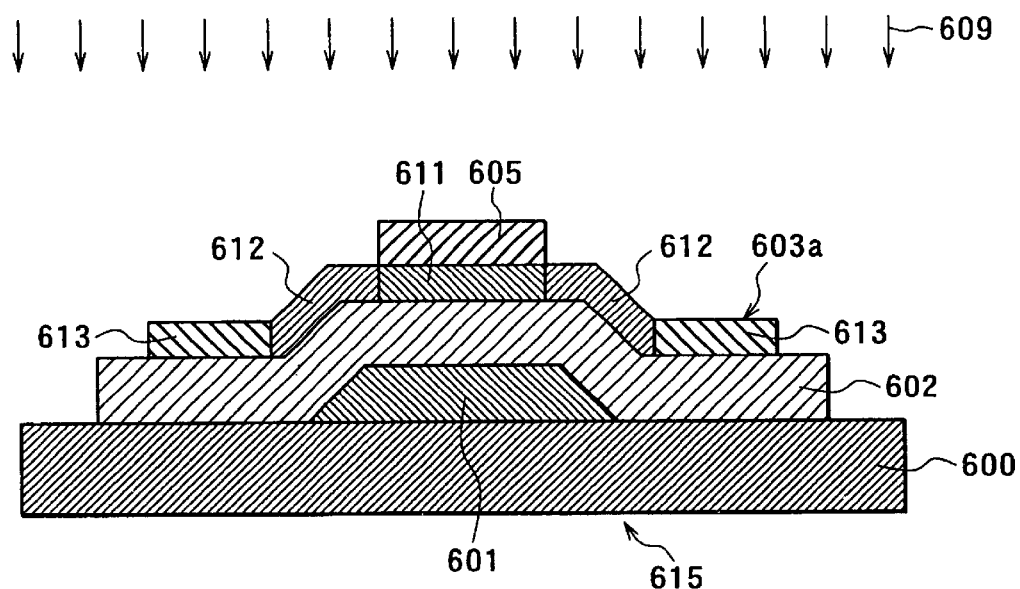
FIGS. 9A and 9B are sectional step diagrams (No. 2) illustrating the first example of the method of fabricating a thin film transistor by application of the method of treating a semiconductor thin film according to the present invention.

Subsequently, as shown in FIG. 9A, Vth ion implantation is applied to the polycrystalline silicon thin film 603*a* as required, for the purpose of controlling the threshold voltage Vth of the thin film transistor. For example, here, $B^+$ ions 609 are injected under the conditions of an acceleration energy of 10 keV and a dose of about $5 \times 10^{11}$ to $4 \times 10^{12}/cm^2$.

Subsequently, on the polycrystalline silicon thin film 603*a* formed by crystallization in the preceding step, an insulating stopper film 605 is formed in the state of being matched to the gate electrode 601. In this case, first, an $SiO_2$ film is formed in a thickness of about 100 to 300 nm by a plasma CVD method. Here, for example, silane gas $SiH_4$ and oxygen $O_2$ are decomposed into plasma, to build up the $SiO_2$ film. Next, the $SiO_2$ film is patterned into a predetermined shape, to form the stopper film 605. In this case, the stopper film 605 is patterned so as to achieve self-matching to the gate electrode 601 by use of a back side exposure technique. The portion of the polycrystalline silicon thin film 603a beneath the stopper film 605 is protected as a channel region 611. As has been described above, $B^+$ ions have preliminarily been injected into the channel region 611 in a relatively low dose by the Vth ion implantation.

Subsequently, with the stopper film 605 as a mask, ion doping is conducted to inject an impurity (for example, $P^+$ ions) into the polycrystalline silicon thin film 603a, thereby forming LDD regions 612. At this time, the dose is, for example, $5\times10^{12}$ to $1\times10^{13}/cm^2$, and the acceleration voltage is, for example, 10 keV. Furtheer, a photoresist (not shown) is patternedly formed so as to cover the stopper film 605 and the LDD regions 612 on both sides thereof, thereafter, with the photoresist as a mask, an impurity (for example, $P^+$ ions) is injected into the polycrystalline silicon thin film 603a in a high concentration, to form source and drain regions 613. The injection of the impurity can be carried out, for example, by ion doping (ion shower). This technique is to inject the impurity by electric-field acceleration without applying mass separation, whereby the impurity is injected in a dose of, for example, about $1\times10^{15}/cm^2$, to form the source and drain regions 613. The acceleration voltage is, for example, 10 keV.

Though not shown in the figure, in the case where a P channel type thin film transistor is fabricated on the same insulating substrate 600 to constitute a CMOS circuit, the region of the N channel type thin film transistor is covered with a photoresist, thereafter the impurity is changed from $P^+$ ions to $B^+$ ions, and ion doping is conducted at a dose of about $1\times10^{15}/cm^2$. In this case, the impurity may be injected by use of a mass separation type ion implantation apparatus.

After the above steps, activation of the impurity injected into the polycrystalline silicon thin film 603a is conducted by RTA (rapid thermal annealing) using a UV lamp. In this case, laser activation annealing using an excimer laser may be conducted, as required. Thereafter, needless portions of the polycrystalline silicon thin film 603a and the gate insulation film 602 are patterned simultaneously to form a thin film transistor 615, and to separate the thin film transistor 615 on a device region basis.

Figure 9B:
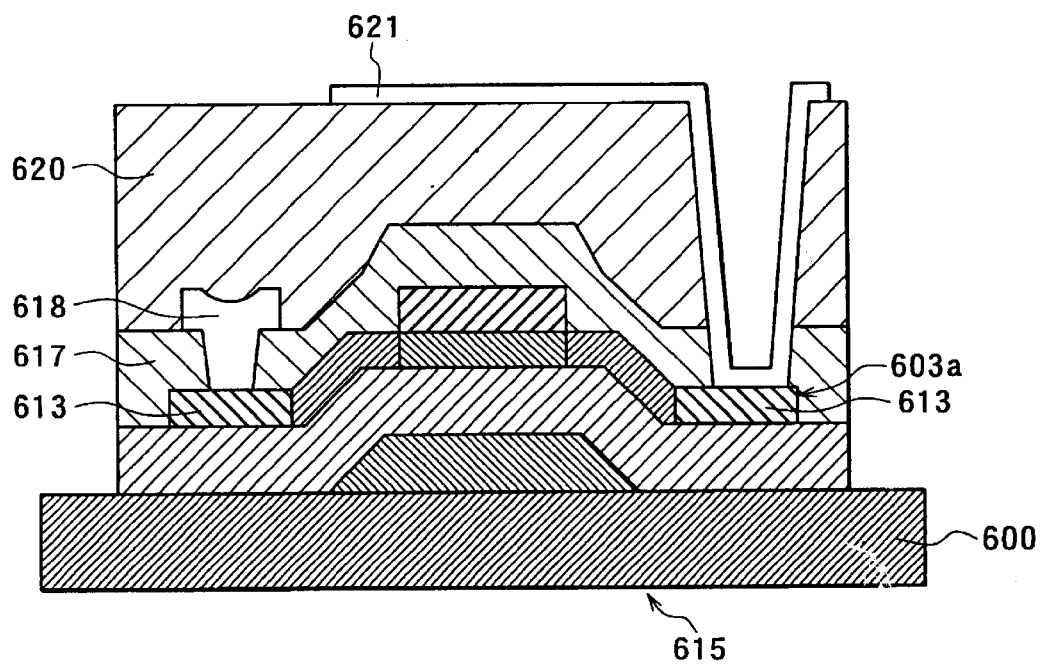

Thereafter, as shown in FIG. 9B, a film of $SiO_2$ in a thickness of about 100 to 200 nm and a film of $SiN_x$ in a thickness of about 200 to 400 nm are successively formed by plasma CVD in the state of covering the thin film transistor 615 on the insulating substrate 600, to form an interlayer dielectric film 617. On this stage, the so-called hydrogenation annealing was conducted; namely, a heat treatment at a temperature of 350 to 400° C. was conducted in nitrogen gas, in a forming gas or in vacuum, to diffuse hydrogen atoms contained in the interlayer dielectric film 617 into the polycrystalline silicon thin film 603a. Thereafter, a contact hole is opened in the interlayer dielectric film 617, and then a film of Mo, Al or the like is sputtered in a thickness of 100 nm to 1 µm, followed by patterning the sputtered film into a predetermined shape to form a wiring electrode 618 connected to the source and drain regions 613. Further, a planarizing layer 620 formed of a photosensitive acrylic resin or the like is applied in a thickness of about 1 to 3 µm, and photolithography is conducted to open a contact hole reaching the source and drain regions 613. Then, a transparent conductive film formed of indium tin oxide ($In_2O_3+SnO_2$; hereinafter referred to as ITO) or the like or a reflective electrode film formed of Ag, Al or the like is sputtered on the planarizing layer 620, and is thereafter patterned into a predetermined shape to form a pixel electrode 621 connected to the source and drain regions 613.

In the polycrystalline silicon thin film transistor 615 fabricated as above, the mobility is 250 to 340 $cm^2/Vs$ for the N channel type and 120 to 180 $cm^2/Vs$ for the P channel type, which is not less than 2 to 3 times higher than that in the prior art. Thus, mobility is largely enhanced.

<Method of Fabricating Thin Film Transistor-2>

Now, a second example of the method of fabricating a thin film transistor by applying the method of treating a semiconductor thin film described above will be described below. Here, as the second example, a method of fabricating a top gate type thin film transistor will be described based on FIGS. 10 and 11. While the method of fabricating an N channel type thin film transistor is shown here, the method can be applied to the P channel in the same manner by only changing the impurity species (dopant species).

Figure 10A:
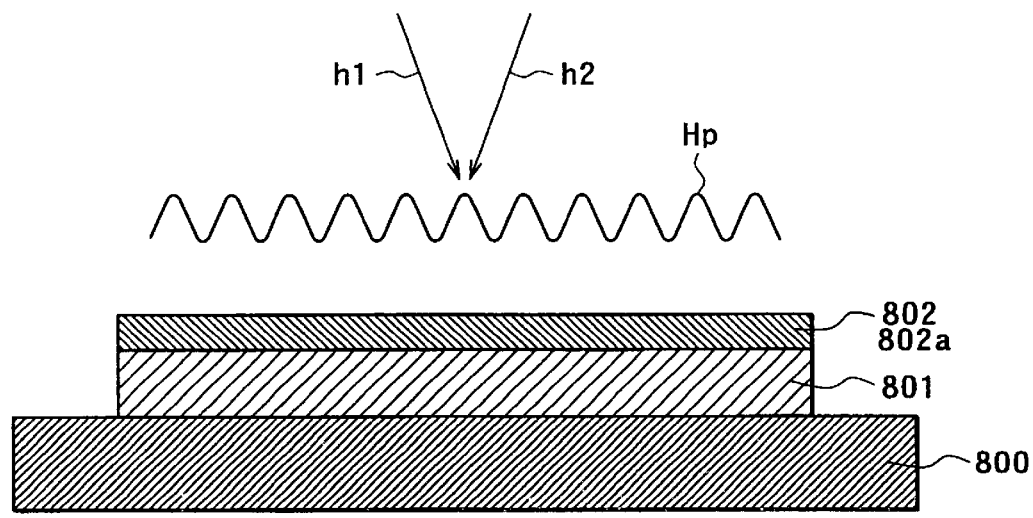
FIGS. 10A and 10B are sectional step diagrams (No. 1) illustrating a second example of the method of fabricating a thin film transistor by application of the method of treating a semiconductor thin film according to the present invention.

First, as shown in FIG. 10A, a ground film with a two-layer structure to be a buffer layer 801 is continuously built up on an insulating substrate 800 by a plasma CVD method. The first layer ground film is formed of $SiN_x$ and has a thickness of 100 to 200 nm. The second layer ground film is formed of $SiO_2$ and has a thickness of 100 to 200 nm. An amorphous silicon thin film 802 is formed on the buffer layer 801 in a thickness of about 30 to 80 nm by a plasma CVD method or an LP-CVD method. Where the plasma CVD method is used for forming the amorphous silicon thin film 802, annealing in nitrogen atmosphere at 400 to 450° C. is conducted for about 1 hr, in order to reduce the amount of hydrogen in the film. Here, if required, Vth ion implantation is conducted as above-described to inject $B^+$ ions into the amorphous silicon thin film 802 in a dose of, for example, $5\times10^{11}$ to $4\times10^{12}/cm^2$. In this case, the acceleration voltage is about 10 keV.

Next, the above-described method of treating the thin film semiconductor substrate (for example, the treating method of First Embodiment) is applied to the amorphous silicon thin film 802; namely, the amorphous silicon thin film 802 is irradiated with a light pattern Hp generated by interference of split laser beams h1 and h2, to crystallize the amorphous silicon thin film 802, thereby forming a polycrystalline silicon thin film 802a.

Figure 10B:
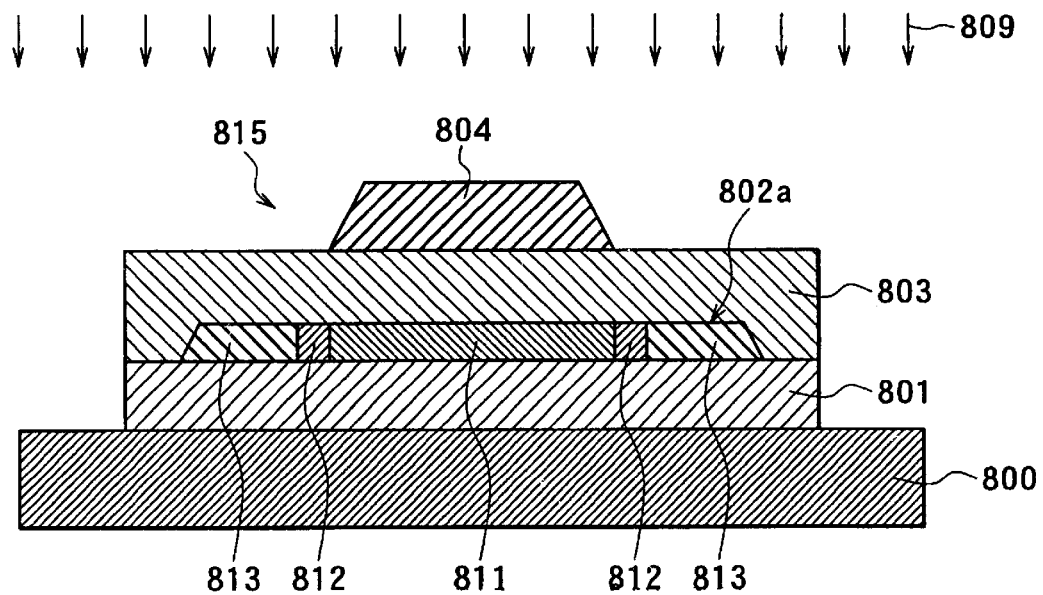

Subsequently, as shown in FIG. 10B, the polycrystalline silicon thin film 802a is patterned into island form. A film of $SiO_2$ is grown on the patterned polycrystalline silicon thin film 802a in a thickness of 10 to 400 nm (here, for example, 100 nm) by a plasma CVD method, a normal pressure CVD method, a low pressure CVD method, an ECR-CVD method, a sputtering method or the like, to form a gate insulation film 803.

Next, a film of Al, Ti, Mo, W, Ta, doped polycrystalline silicon or the like or an alloy thereof is formed on the gate insulation film 803 in a thickness of 100 to 800 nm, and is patterned into a predetermined shape to form a gate electrode 804. The portion of the polycrystalline silicon thin film 802a beneath the gate electrode 804 is protected as a channel region 811. As described above, $B^+$ ions have preliminarily been injected into the channel region 811 in a comparatively low dose by Vth ion implantation.

Next, $P^+$ ions are injected into the polycrystalline silicon thin film 802a by an ion injection method using mass separation, to provide LDD regions 812. The ion injection is conducted over the whole surface of the polycrystalline silicon thin film 802a with the gate electrode 804 as a mask. The dose is $6 \times 10^{12}$ to $5 \times 10^{13}/cm^2$. The acceleration voltage is, for example, 90 keV. Thereafter, a resist pattern (omitted in the figure) is formed so as to cover the gate electrode 804 and the surroundings thereof, and P+ ions are injected in a high concentration by an ion shower doping method of the mass non-separation type, to form source and drain regions 813. In this case, the dose is, for example, $1 \times 10^{15}/cm2$, and the acceleration voltage is, for example, 90 keV. As the doping gas, a hydrogen-diluted 20% $PH_3$ gas is used.

Though not shown here, where a P channel type thin film transistor is formed on the same insulating substrate 800 to constitute a CMOS circuit, the region of the N channel type thin film transistor is covered with a photoresist, then the doping gas is changed to a 5 to 20% $B_2H_2/H_2$ gas, and ion injection is conducted under the conditions of a, dose of about $1 \times 10^{15}$ to $3 \times 10^{15}/cm^2$ and an acceleration voltage of, for example, 90 keV. The formation of the source and drain regions 813 may be conducted by use of a mass separation type ion injection apparatus.

Thereafter, a treatment for activation of the dopant injected into the polycrystalline silicon thin film 802a is conducted. The activation treatment can be carried out by use of RTA (rapid thermal annealing) using a UV lamp, in the same manner as in the case of fabrication of a bottom gate type thin film transistor. Thereafter, needless portions of the gate insulation film 803 and the buffer layer 801 are simultaneously patterned, to separate the thin film transistor 815 on a device region basis.

Figure 11:
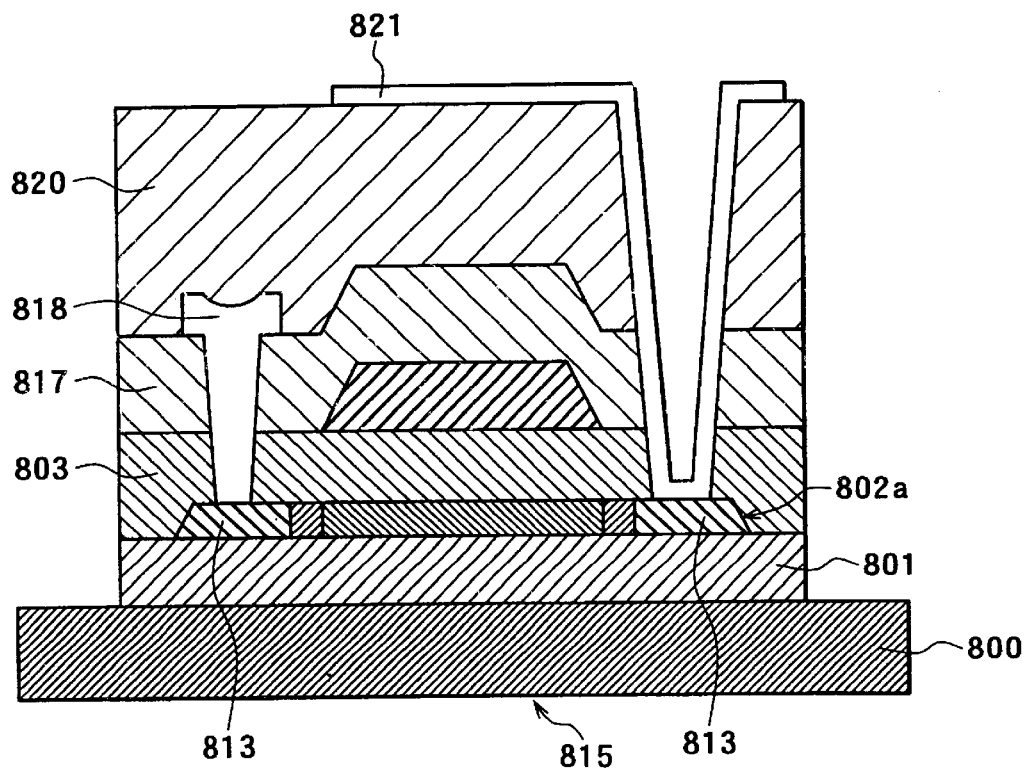
FIG. 11 is a sectional step diagram (No. 2) illustrating the second example of the method of fabricating a thin film transistor by application of the method of treating a semiconductor thin film according to the present invention.

Thereafter, as shown in FIG. 11, a film of $SiO_2$ in a thickness of about 100 to 200 nm and a film of $SiN_x$ in a thickness of about 200 to 400 nm were successively formed by plasma CVD, in the state of covering the thin film transistor 815 on the insulating substrate 800, to form an interlayer dielectric film 817. On this stage, the so-called hydrogenation annealing was conducted; namely, a heat treatment at about 350 to 400° C. was conducted in nitrogen gas, in a forming gas or in vacuum for 1 hr, to diffuse hydrogen atoms contained in the interlayer dielectric film 817 into the polycrystalline silicon thin film 802a. Thereafter, a contact hole is opened in the interlayer dielectric film 817 and the gate insulation film 803, and then Al—Si or the like is sputtered, followed by patterning into a predetermined shape to form a wiring electrode 818 connected to the source and drain regions 813. Further, a planarizing layer 820 formed of a photosensitive acrylic resin or the like is applied in a thickness of about 1 to 3 μm, and then photolithography is conducted to open a contact hole reaching the source and drain regions 813. A transparent conductive film formed of ITO or the like or a reflective electrode film formed of Ag, Al or the like is sputtered on the planarizing layer 820, and is patterned into a predetermined shape to form a pixel electrode 821 connected to the source and drain regions 813.

In the polycrystalline silicon thin film transistor 815 fabricated as described above, the mobility is 310 to 420 $cm^2/Vs$ for the N channel type and 150 to 210 $cm^2/Vs$ for the P channel type, which is higher than that in the prior art.

<Display System>

Figure 12:
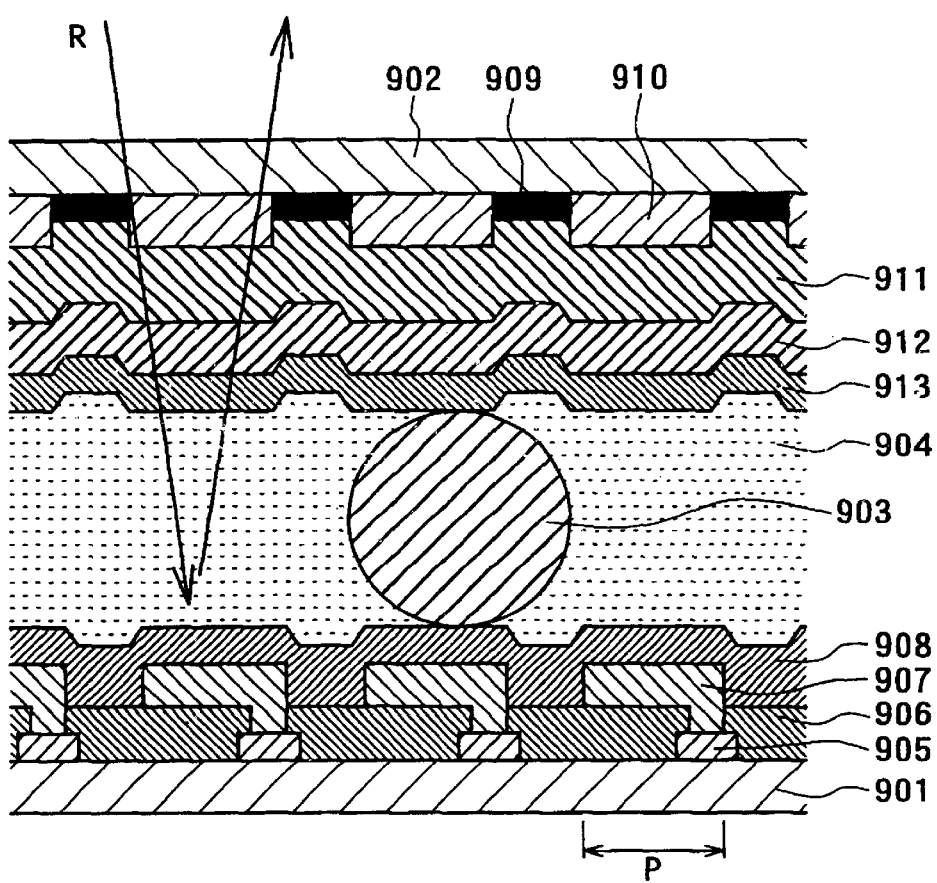
FIG. 12 is a sectional view of a major part of a display system constituted by use of a thin transistor obtained by application of the method of treating a semiconductor thin film according to the present invention.

FIG. 12 is a sectional structural view of a display portion (pixel portion) of an active matrix reflection type liquid crystal display panel (display system) constituted by use of the bottom gate type thin film transistor or the top gate type thin film transistor fabricated as described above.

The display system shown in the figure has a panel structure in which a pair of insulating substrates 901 and 902 are laminated on each other with spacers 903 having a diameter of 2 to 5 μm therebetween and with an electro-optical substance 904 held therebetween. As the electro-optical substance 904, torsion nematic (TN) type liquid crystal materials are widely used.

On the insulating substrate 901 on the lower side (the side of the electro-optical substance 904), a laminate structure is provided in which thin film transistors 905, a light scattering layer 906 consisting of a resin layer having a roughness of 1 to 2 μm, pixel electrodes 907 consisting of a silver thin film having a thickness of 100 to 300 nm and connected respectively to the thin film transistors 905, and a polyimide oriented film 908 having a thickness of 50 to 150 nm are sequentially laminated. Particularly, the thin film transistors 905 are bottom gate type thin film transistors or top gate type thin film transistors which are obtained by the above-described method.

On the other hand, on the insulating substrate 902 on the upper side (on the side of the electro-optical substance 904), a laminate structure is provided in which a black matrix 909 for inter-pixel light shielding formed by patterning a sputtered chromium thin film by photolithography and wet etching, red, green and blue color filter patterns 910 provided in the gaps in the black matrix 909, an overcoat layer 911 having a thickness of 1 to 3 μm covering these, an ITO common electrode 912 having a thickness of 100 to 200 nm, and a polyimide oriented film 913 having a thickness of 50 to 150 nm are sequentially laminated.

In the display system constituted as above, the thin film transistors 905 functioning as switching devices for the pixel electrodes 907 are fabricated according to the present invention, and mobility and uniformity of characteristics are higher than those in the prior art. As a result, there are obtained the merits that uniformity of display is also improved and that generation of display spots and luminescent spots in half tone which occurs in the case where the thin film transistors are fabricated by the conventional polycrystallization process can be obviated.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor manufacturing device comprising:
   a laser source;
   a splitting means for splitting an output from the laser source into a plurality of beams;
   an interference means for causing said plurality of beams split by said splitting means to interfere and form a periodic radiation pattern on a surface of a semiconductor device structure; and
   a phase shifting means for electro-optically shifting the phase of at least one of said plurality of beams split by said splitting means.

2. A semiconductor manufacturing device according to claim 1, wherein said laser light generation means source is a pulse oscillation laser utilizing laser diode excitation.

3. A method of treating a semiconductor device structure, comprising:
   generating a laser beam with a laser source;
   splitting the laser beam into a plurality of beams;
   creating an interference pattern with the plurality of beams; and irradiating said semiconductor device structure with a periodic pattern generated by interference of the plurality of beams.

4. A method of treating a semiconductor device structure according to claim 3, wherein said laser source is pulse-oscillated by laser diode excitation.

5. A semiconductor manufacturing device according to claim 1, wherein the laser source is an excimer laser, and a wavelength of said laser is in a range of 150 to 450 nm.

6. A semiconductor manufacturing device according to claim 1, wherein a period of light interference is in a range of 0.5 to 20 µm.

7. A semiconductor manufacturing device according to claim 1, wherein the periodic radiation pattern is used to melt a device material and a melting width or melting diameter is in a range of 0.5 to 20 µm.

8. A method of treating a semiconductor device structure according to claim 3, wherein the laser source is an excimer laser, and the wavelength of said laser is in a range of 150 to 450 nm.

9. A method of treating a semiconductor device structure according to claim 3, wherein a period of interference is in a range of 0.5 to 20 µm.

10. A method of treating a semiconductor device structure according to claim 3, wherein the periodic pattern is applied to regions of the device structure which are melted and a melting width or melting diameter is in range of 0.5 to 20 µm.

11. A method of treating a semiconductor device structure according to claim 3, further comprising:

applying the periodic pattern to a plurality of first regions of the device structure;

moving the periodic pattern by electro-optically shifting the phase of at least one of said beams; and thereafter applying the periodic pattern to a plurality of second regions of the device structure.

12. A method of treating a semiconductor device structure according to claim 11, wherein the first regions are melted with the periodic pattern and a melting width or melting diameter is in a range of 0.5 to 20 µm.

* * * * *